(12) United States Patent
Fukuda et al.

(10) Patent No.: US 6,275,428 B1
(45) Date of Patent: Aug. 14, 2001

(54) MEMORY-EMBEDDED SEMICONDUCTOR INTEGRATED CIRCUIT DEVICE AND METHOD FOR TESTING SAME

(75) Inventors: Ryo Fukuda; Osamu Wada; Shinji Miyano, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/598,209

(22) Filed: Jun. 21, 2000

(30) Foreign Application Priority Data

Jun. 22, 1999 (JP) .................................................. 11-175783

(51) Int. Cl.[7] ..................................................... G11C 7/00

(52) U.S. Cl. .......................................... 365/201; 365/233

(58) Field of Search ..................................... 365/201, 233

(56) References Cited

U.S. PATENT DOCUMENTS

| | | | |
|---|---|---|---|
| 5,930,187 | * | 7/1999 | Sato et al. ............................. 365/201 |
| 5,954,830 | * | 9/1999 | Ternullo, Jr. .......................... 714/718 |
| 6,058,468 | * | 5/2000 | Funyu .................................... 712/39 |

OTHER PUBLICATIONS

Tomoaki Yabe et al., "A Configurable DRAM Macro Design for 2112 Derivative Organizations to be Synthesized Using a Memory Generator", IEEE Journal of Solid–State Circuits, vol. 33, No. 22, Nov. 1998, pp. 1752–1757.

U.S. Patent Application Serial No. 09/405,128, filed Sep. 24, 1999.

* cited by examiner

*Primary Examiner*—Son T. Dinh
(74) *Attorney, Agent, or Firm*—Finnegan, Henderson, Farabow & Dunner, L.L.P.

(57) ABSTRACT

There is provided a memory-embedded semiconductor integrated circuit device capable of being tested in a shorter test time. The memory-embedded semiconductor integrated circuit device includes: a logic part provided on a semiconductor substrate; a memory macro provided on the semiconductor substrate to be consolidated with the logic part; a test input terminal for inputting a test input signal; a test circuit including a test signal generator for generating an output switching signal and a test signal, which serves to carry out a test operation of the memory macro, on the basis of the test input signal, and a switching circuit for selectively outputting one of an output of the memory macro, which has been test-operated by the test signal, and the test input signal in accordance with the output switching signal; and a test output terminal for receiving an output of the switching circuit to output the output of the switching circuit to the outside.

20 Claims, 26 Drawing Sheets

WHEN $m \leqq n \leqq 2m$

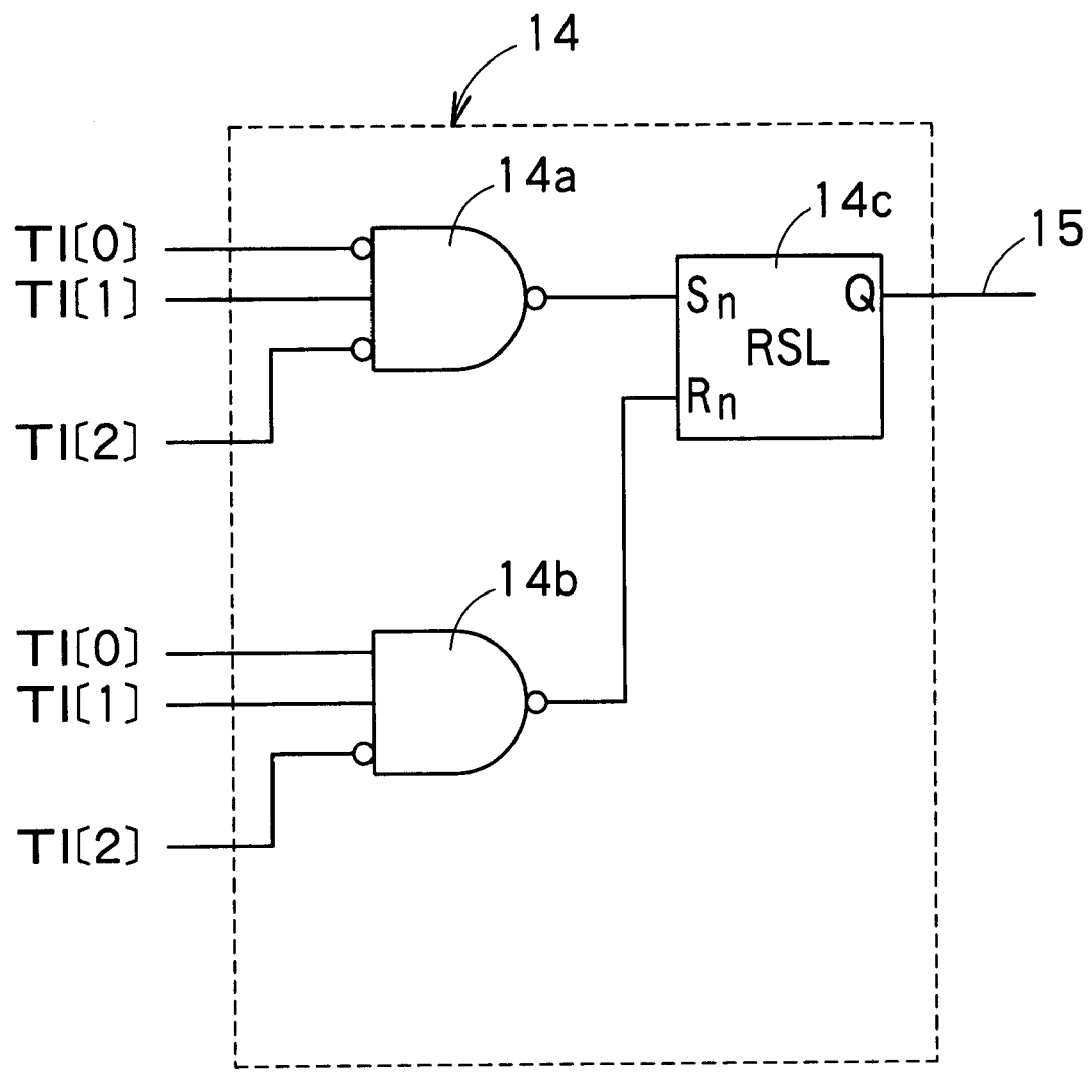
F I G. 6

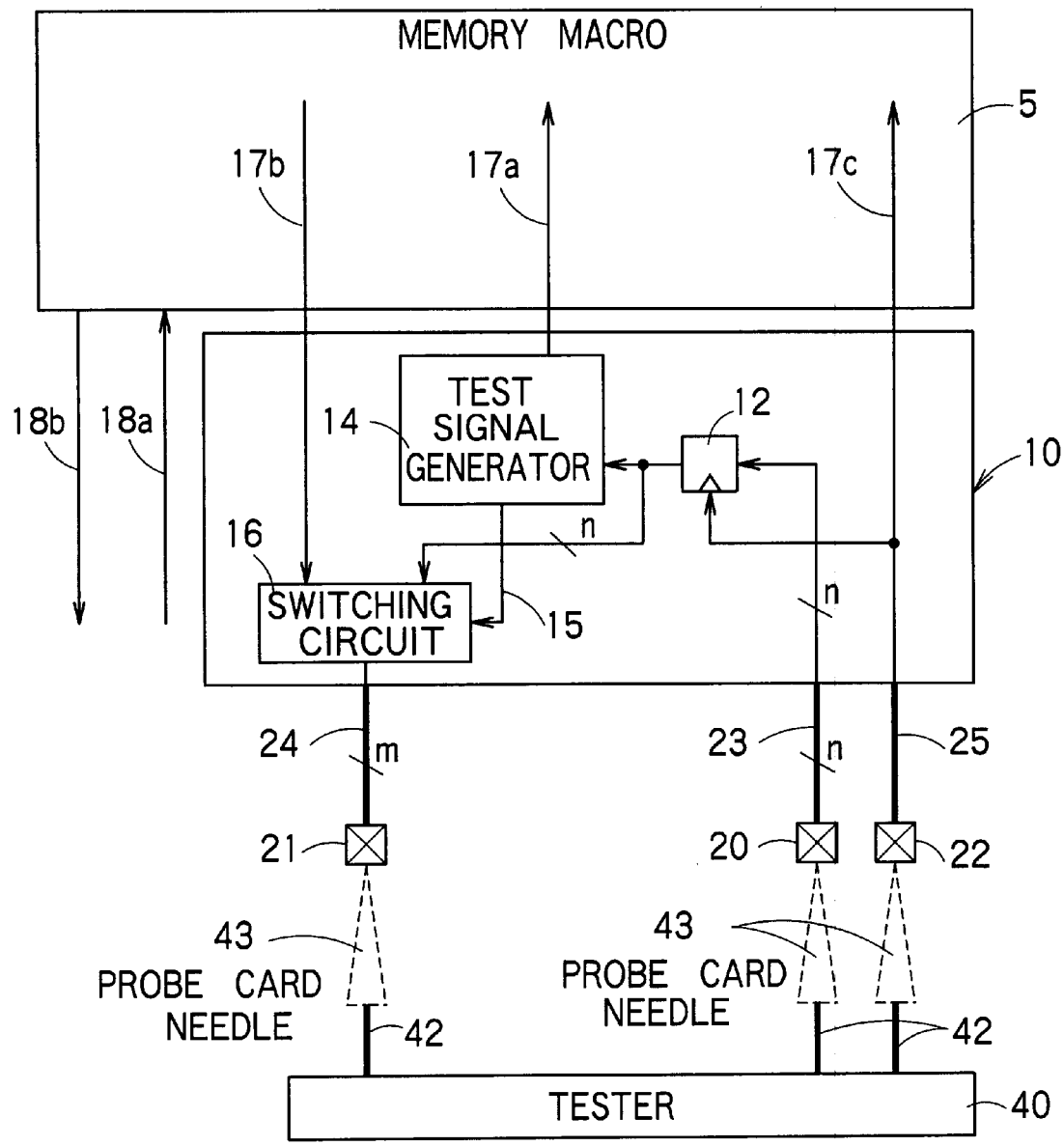
F I G. 9

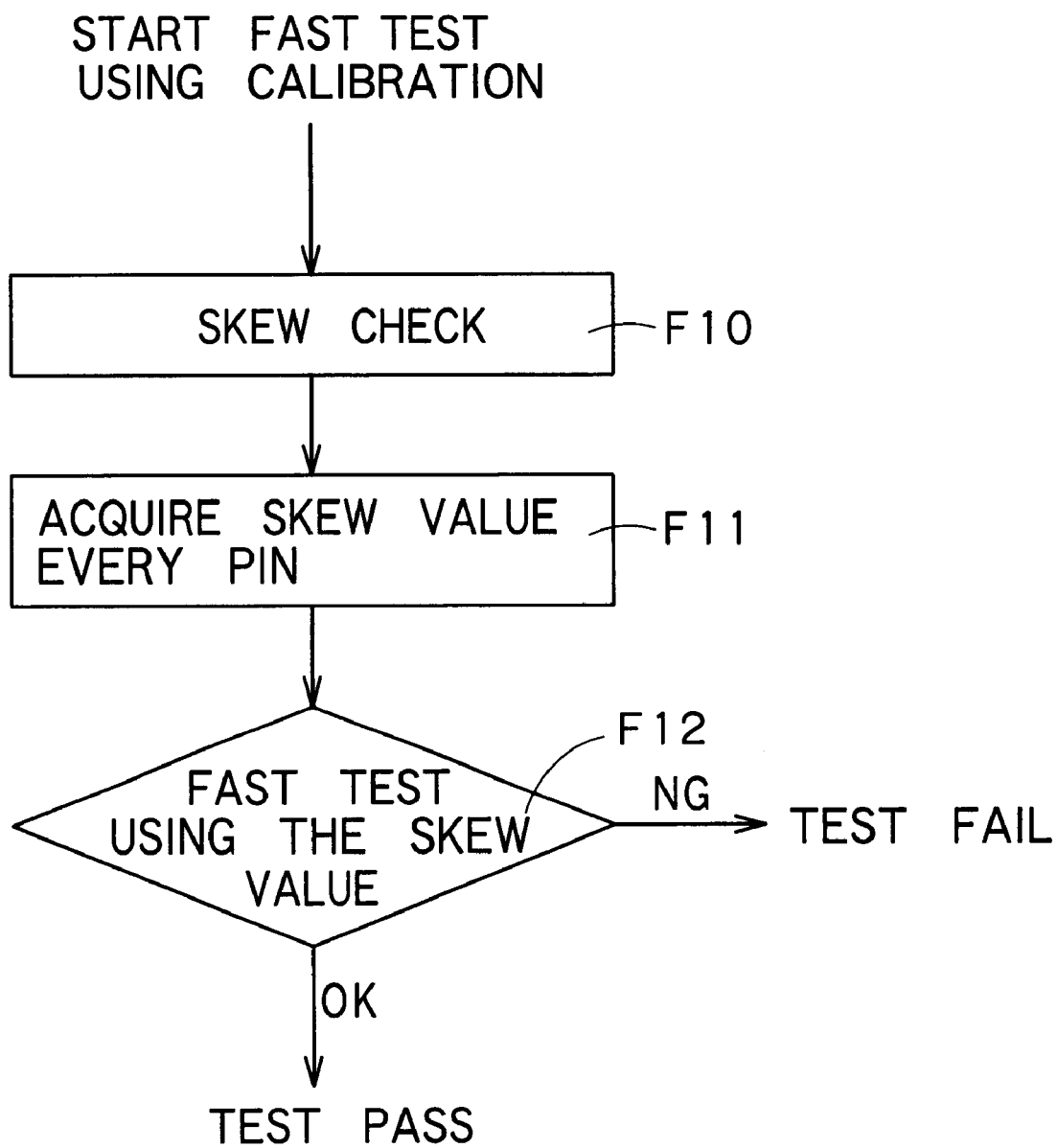
F I G. 14

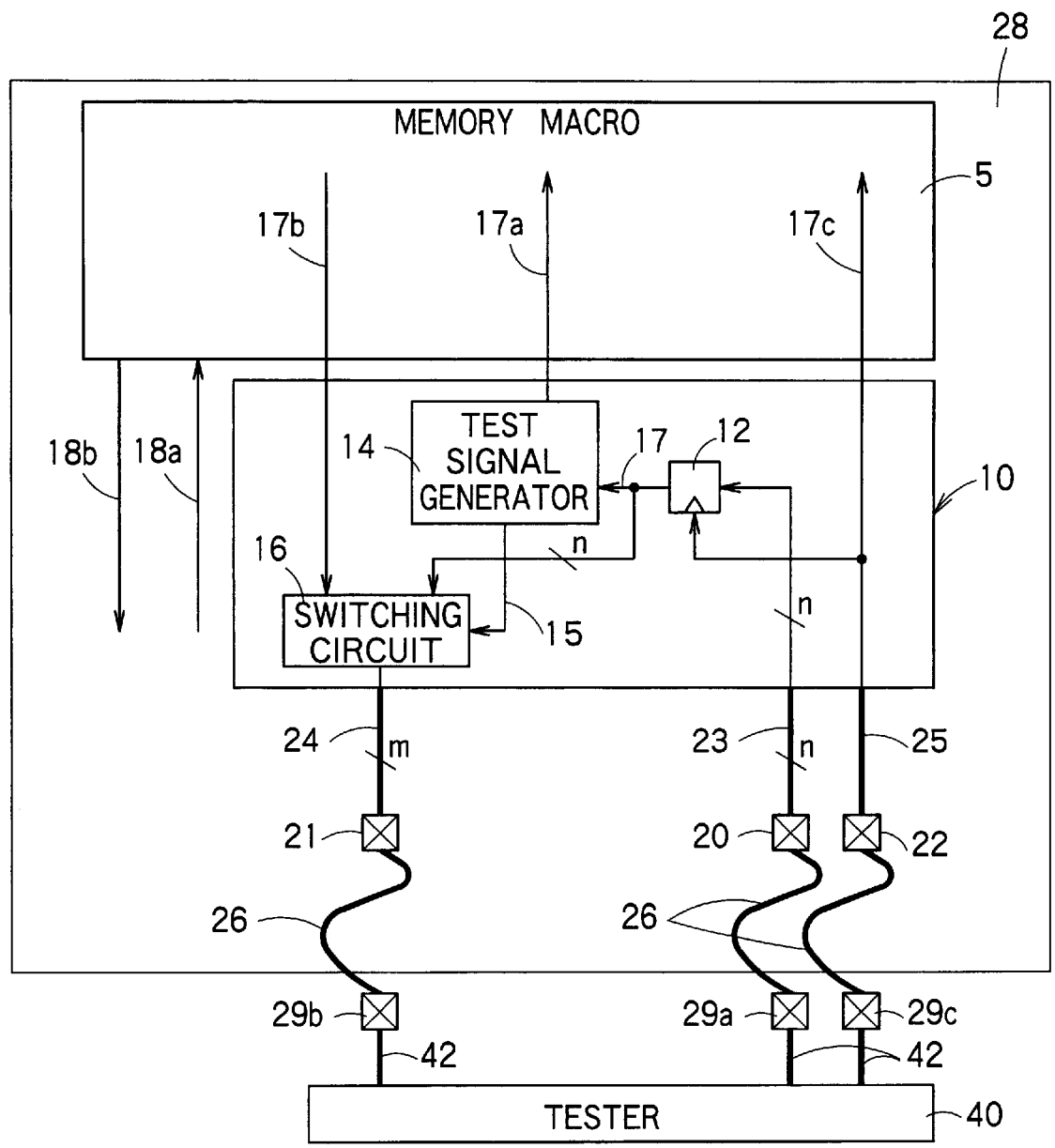
F I G. 15

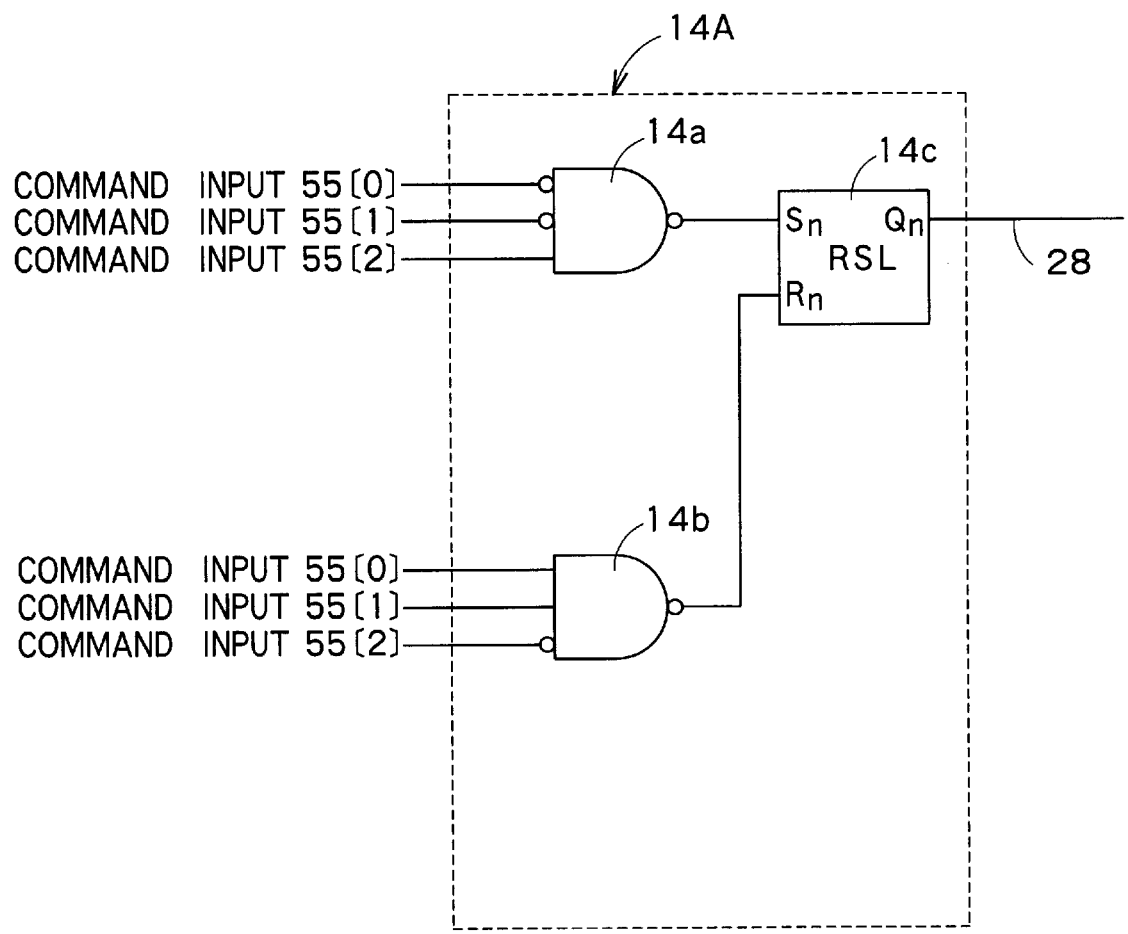
F I G. 20

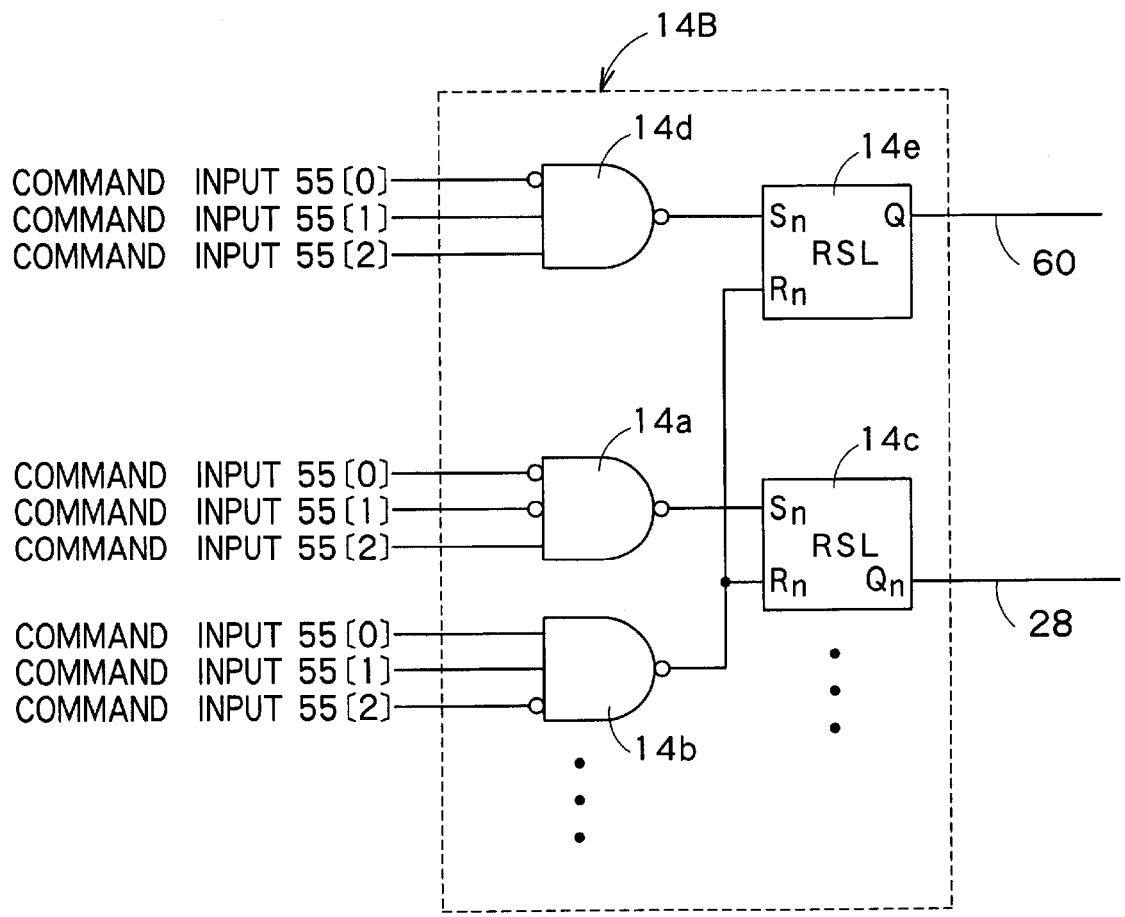
F I G. 22

MEMORY-EMBEDDED SEMICONDUCTOR INTEGRATED CIRCUIT DEVICE AND METHOD FOR TESTING SAME

This application claims benefit of priority under 35USC §119 to Japanese Patent Application No. H11-175783, filed on Jun. 22, 1999, the entire contents of which are incorporated by reference herein.

BACKGROUND OF THE INVENTION

1. Field of the Invention

The present invention relates generally to a memory-embedded semiconductor integrated circuit device wherein a memory and a logic part are consolidated on one chip, and a method for testing the same.

2. Description of Related Art

In recent years, there have been proposed various semiconductor integrated circuit devices wherein a large scale memory macro is consolidated with a logic part, such as application specific integrated circuits (ASICs) and micro processors. In a memory-embedded LSI of this type, the usual operation of a memory macro is controlled by a signal from a logic part. For example, if a read instruction is given from the logic part, the memory macro outputs data of a selected address to the logic part. Similarly, if a write instruction is inputted from the logic part, data inputted simultaneously with the instruction are written at the address of the selected memory macro. In the memory-embedded LSI of this type, there are two methods for testing a memory macro. One method is a method for testing a memory macro by controlling the operation of the memory macro via a logic part without the need of a dedicated test circuit. The other method is a method for testing a memory macro regardless of a logic part, by providing a dedicated test circuit and a testing input/output pad. Since the former increases a vector length in a large scale memory macro, the latter test method is generally used.

A first example of a conventional memory-embedded semiconductor integrated circuit device, which is provided with a dedicated test circuit, is shown in FIG. 26. In this first conventional example, a memory-embedded semiconductor integrated circuit device 100 comprises a logic part 3 comprising a gate array or a standard cell, a memory macro 5, and a test circuit 110 for evaluating the operating characteristics of the memory macro 5. Furthermore, the memory-embedded semiconductor integrated circuit device 100 is provided with an I/O part 2, which has a test input terminal group 20 of n terminals and a test output terminal group 21 of m terminals, on the periphery thereof.

The test circuit 110 has a test signal generator 140. The test signal generator 140 is connected, via a test input wire 23, to the test input terminal group 20, to which an n-bit test command is inputted from a tester (not shown). The test circuit 110 is also connected to the test output terminal group 21 via a test output wire 24 to output m-bit test data. This test signal generator 140 decodes the test command to generate a test signal 17a for carrying out the test operation of the memory macro 5.

In general, as shown in FIG. 27, the memory macro 5 has a plurality of memories 70, each of which comprises a memory cell array 71, a column address decoder 72 and a row address decoder 74. When the test signal 17a is inputted to a memory cell array 71, which is to be tested, in the memory macro 5, an m-bit test data output 17b is outputted from the memory cell array 71 to the test circuit 110. This test data output 17b is outputted to the test output terminal group 21 via the test circuit 110 and the test output wire 24. Then, on the basis of the test data output which has been outputted to the test output terminal group 21, a tester (not shown) determines a pass/fail.

Furthermore, the memory macro 5 has a terminal for receiving an input 18a in a usual operation and a terminal for outputting a data output 18b, as well as a terminal for receiving the test signal and a terminal for outputting the test data output 17b.

Then, a second example of a conventional memory-embedded semiconductor integrated circuit device is shown in FIG. 28. In this second conventional example of the memory-embedded semiconductor integrated circuit device, the test circuit 110 of the memory-embedded semiconductor integrated circuit device in the first conventional example shown in FIG. 26 is replaced with a test circuit 110A, and the I/O part (not shown) is provided with a test clock input terminal 22.

The test circuit 110A comprises a flip-flop circuit 12 for incorporating an n-bit test command in synchronism with a clock, and a test signal generator 140 for decoding the output of the flip-flop circuit 12 to generate a test signal for carrying out the test operation of a memory macro 5. Furthermore, although only one flip-flop circuit 12 is shown in the figure, n flip-flop circuits are provided in practice.

A test command outputted from a tester 40 is inputted to the flip-flop 12 via a lead wire 42, a probe card needle 43, a test input terminal group 20 and a test input wire 23. A test clock outputted from the tester 40 is inputted to the flip-flop circuit 12 via a lead wire 42, the probe card needle 43, a test clock input terminal 22 and a test clock wire 25, and inputted to the memory macro 5 as a clock input 17c.

Furthermore, the m-bit test data output 17b outputted from the memory macro is outputted to a test output terminal group 21 via the test circuit 110A and a test output wire 24.

The wafer test for the second conventional example of the memory-embedded semiconductor integrated circuit device is carried out as follows. First, the probe card needle 43 is connected to the test input terminal group 20, the test output terminal group 21 and the test clock input terminal 22. Thereafter, from the tester 40, a test command is inputted to the test input terminal group 20, and a test clock is inputted to the test clock input terminal 22.

Then, the test command inputted to the test input terminal group 20 is incorporated into the flip-flop circuit 12 in synchronism with the test clock which has been inputted to the test clock input terminal 22, and then, outputted from the flip-flop circuit 12 in synchronism with the test clock to be an incorporated test command. This incorporated test command is decoded in the test signal generator 140 to be a test signal 18a, which serves to carry out the test operation of the memory macro 5, to be fed to the memory macro 5. Thereafter, an m-bit test data output 17b is outputted from the memory macro 5 to the test output terminal group 21 via the test circuit 110A and the test output wire 24. Then, the test data output 17b outputted to the test output terminal group 21 is fed to the tester 40 via the probe card needle 43 and the lead wire 42. On the basis of this test data output 17b, the tester 40 determine a pass/fail.

Furthermore, in the second conventional example of the memory-embedded semiconductor integrated circuit device, the length and capacity of the test input wire 23, the test output wire 24 and the test clock input wire 25 are different every product.

In the first conventional example of the memory-embedded semiconductor integrated circuit device with the above described construction, if a test is carried out when there are defects between the test input terminal group 20 and the input end of the memory macro 5 or when there are defects between the output end of the memory macro and the test output terminal group 21, it is not possible to identify whether the defects exist in the memory macro 5 or the test path (e.g., the test input wire 23 and the test circuit 110). Therefore, there is a problem in that it takes a lot of time to analyze the defects, so that it takes a lot of time to carry out the test.

In addition, in the first conventional example, there is some possibility that the wiring length between the test input terminal group 20 and the test circuit 110 is different from each other. Thus, there is a problem in that the wiring capacity of the test input wire 23 is different from each other to cause a skew between test commands until each of the test commands is inputted to the test signal generator 140, so that the test circuit malfunctions.

In addition, in the second conventional example, since the lengths of the test input wire 23, the test output wire 24 and the test clock input wire 25 are different every product, it is required to carry out a calibration every one kind when a test is carried out. In order to carry out the calibration, it is required to provide a stably operated chip, or it is required to observe the internal waveform, so that there is a problem in that it takes a lot of time to carry out the test.

Moreover, in the second conventional example, since the flip-flop 12 is provided upstream of the test signal generator 140, the test command can be incorporated in synchronism with the clock, so that there is no problem in that the skew is caused between the test commands. However, there is a problem in that it is not possible to vary the timing in carrying out the input to the memory macro 5 when evaluating the memory macro 5.

SUMMARY OF THE INVENTION

It is therefore a first object of the present invention to eliminate the aforementioned problems and to provide a memory-embedded semiconductor integrated circuit device capable of being tested in a shorter test time, and a method for testing the same.

It is a second object of the present invention to provide a memory-embedded semiconductor integrated circuit device capable of preventing a test circuit from malfunctioning.

It is a third object of the present invention to provide a memory-embedded semiconductor integrated circuit device capable of being tested at various timings in carrying out the input to a memory macro, and a method for testing the same.

In order to accomplish the aforementioned and other objects, according to a first aspect of the present invention, a memory-embedded semiconductor integrated circuit device comprises: a logic part provided on a semiconductor substrate; a memory macro provided on the semiconductor substrate to be consolidated with the logic part; a test input terminal for inputting a test input signal; a test circuit including a test signal generator for generating an output switching signal and a test signal, which serves to carry out a test operation of the memory macro, on the basis of the test input signal, and a switching circuit for selectively outputting one of an output of the memory macro, which has been test-operated by the test signal, and the test input signal in accordance with the output switching signal; and a test output terminal for receiving an output of the switching circuit to output the output of the switching circuit to the outside.

Thus, according to the present invention, the memory-embedded semiconductor integrated circuit device can identify whether defects exist in a memory macro or a test path, so that it is possible to shorten the test time.

According to a second aspect of the present invention, a memory-embedded semiconductor integrated circuit device comprises: a logic part provided on a semiconductor substrate; a memory macro provided on the semiconductor substrate to be consolidated with the logic part; an input terminal for inputting an input signal; a timing adjusting circuit for incorporating and outputting the input signal, which is inputted via the input terminal, in synchronism with a clock signal, or for immediately incorporating and outputting the input signal, in accordance with a control signal; a generator for generating a signal, which serves to operate the memory macro, on the basis of the input signal which is fed via the timing adjusting circuit; and an output terminal for receiving an output of the memory macro, which has been operated by the signal, to output the output of the memory macro to the outside.

Thus, according to the present invention, the memory-embedded semiconductor integrated circuit device can change the timing in inputting an input signal to a memory macro.

According to a third aspect of the present invention, there is provided a method for testing a memory-embedded semiconductor integrated circuit device comprising: a logic part provided on a semiconductor substrate; a memory macro provided on the semiconductor substrate to be consolidated with the logic part; a test input terminal for inputting a test input signal comprising a test command or test data; a test circuit including a test signal generator for generating an output switching signal and a test signal, which serves to carry out a test operation of the memory macro, on the basis of the test input signal, and a switching circuit for selectively outputting one of an output of the memory macro, which has been test-operated by the test signal, and the test input signal in accordance with the output switching signal; and a test output terminal for receiving an output of the switching circuit to output the output of the switching circuit to the outside, the method comprising the steps of: inputting the test command to the test input terminal, and activating the output switching signal; inputting the test data to the test input terminal; and receiving data, which are outputted from the switching circuit, via the test output terminal to compare the received data with the test data.

Thus, according to the present invention, the method for testing the memory-embedded semiconductor integrated circuit device can identify whether defects exist in a memory macro or a test path, so that it is possible to shorten the test time.

According to a fourth aspect of the present invention, there is provided a method for testing a memory-embedded semiconductor integrated circuit device comprising: a logic part provided on a semiconductor substrate; a memory macro provided on the semiconductor substrate to be consolidated with the logic part; a test input terminal for inputting a test input signal comprising a test command or test data; a test circuit including a timing adjusting circuit for incorporating and outputting the test input signal, which is inputted via the test input terminal, in synchronism with a clock signal, or for immediately incorporating and outputting the test input signal, in accordance with a control signal, and a test signal generator for generating a test signal, which serves to operate the memory macro, on the basis of the test input signal which is fed via the timing adjusting circuit; and a test output terminal for receiving an output of the memory macro, which has been operated by the test signal, to output the output of the memory macro to the outside, the method comprising the step of: changing a timing in inputting the test data to the test input terminal, to repeat the input of the test data to the test input terminal while the control signal is in an inactive state.

Thus, according to the present invention, the method for testing the memory-embedded semiconductor integrated circuit device can change the timing in inputting an input signal to a memory macro, to carry out the test.

BRIEF DESCRIPTION OF THE DRAWINGS

The present invention will be understood more fully from the detailed description given here-below and from the accompanying drawings of the preferred embodiments of the invention. However, the drawings are not intended to imply limitation of the invention to a specific embodiment, but are for explanation and understanding only.

In the drawings:

FIG. 6 is a circuit diagram showing the construction of a concrete example of a test signal generator;

FIG. 9 is a block diagram showing the construction of the third preferred embodiment of the present invention;

FIG. 14 is a flow chart for explaining a method for carrying out a fast test in the third preferred embodiment;

FIG. 15 is a block diagram showing the construction of a modified example of the third preferred embodiment;

FIG. 20 is a circuit diagram showing a concrete example of a test signal generator for use in the fifth preferred embodiment;

FIG. 22 is a circuit diagram showing the construction of a concrete example of a test signal generator for use in the sixth preferred embodiment;

DESCRIPTION OF THE PREFERRED EMBODIMENTS (First Preferred Embodiment)

Figure 1:
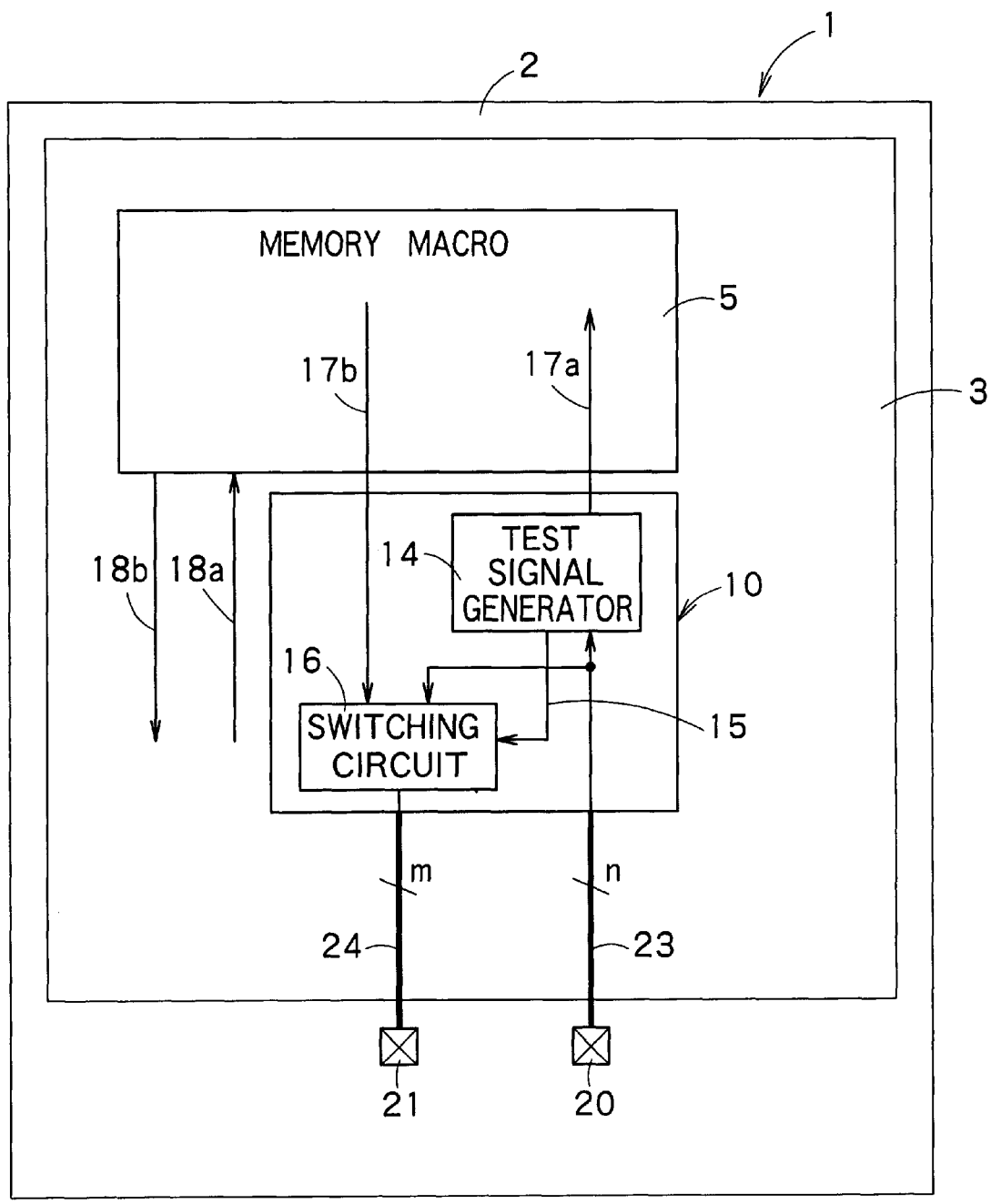
FIG. 1 is a block diagram showing the construction of the first preferred embodiment of the present invention.

FIG. 1 shows the construction of the first preferred embodiment of a memory-embedded semiconductor integrated circuit device according to the present invention. In this first preferred embodiment, a memory-embedded semiconductor integrated circuit device 1 comprises a logic part 3 comprising a gate array or a standard cell, a memory macro 5, and a test circuit 10 for evaluating the operating characteristics of the memory macro 5. Furthermore, the memory-embedded semiconductor integrated circuit device 1 is provided with an I/O part 2 which has a test input terminal group 20 of n test input terminals and a test output terminal group 21 of m test output terminals.

The test circuit 10 has a test signal generator 14 and a switching circuit 16. The test signal generator 14 is connected to the test input terminal group 20 via a test input wire 23. This test signal generator 14 decodes a n-bit test command, which is fed from a tester (not shown) via the test input terminal group 20 and the test input wire 23, to generate a signal, which serves to carry out the test operation of the memory macro 5, i.e., a test signal 17a, and an activated input/output connecting signal (an output switching signal). Furthermore, the test signal generator 14 may output a test command as a test signal without decoding the test command.

Furthermore, if the test signal 17a is inputted to the memory macro 5, an m-bit test data output 17b is outputted from the memory macro 5.

When the switching circuit 16 receives the activated input/output connecting signal from the test signal generator 14, the switching circuit 16 selects a test command which is fed from the test input terminal group 20 and test input wire 23. When the activated input/output connecting signal 15 is not received, i.e., when the input/output connecting signal is in an inactive state, the switching circuit 16 selects and outputs the test data output 17b which is outputted from the memory macro 5. The output of the switching circuit 16 is fed to the tester (not shown) via the test output wire 24 and the test output terminal group 21 to determine a pass/fail.

Furthermore, the memory macro 5 has a terminal for receiving an input 18a in a usual operation and a terminal for outputting a data output 18b in a usual operation, as well as a terminal for receiving the test signal 17a and a terminal for outputting the test data output 17b.

Figure 2:
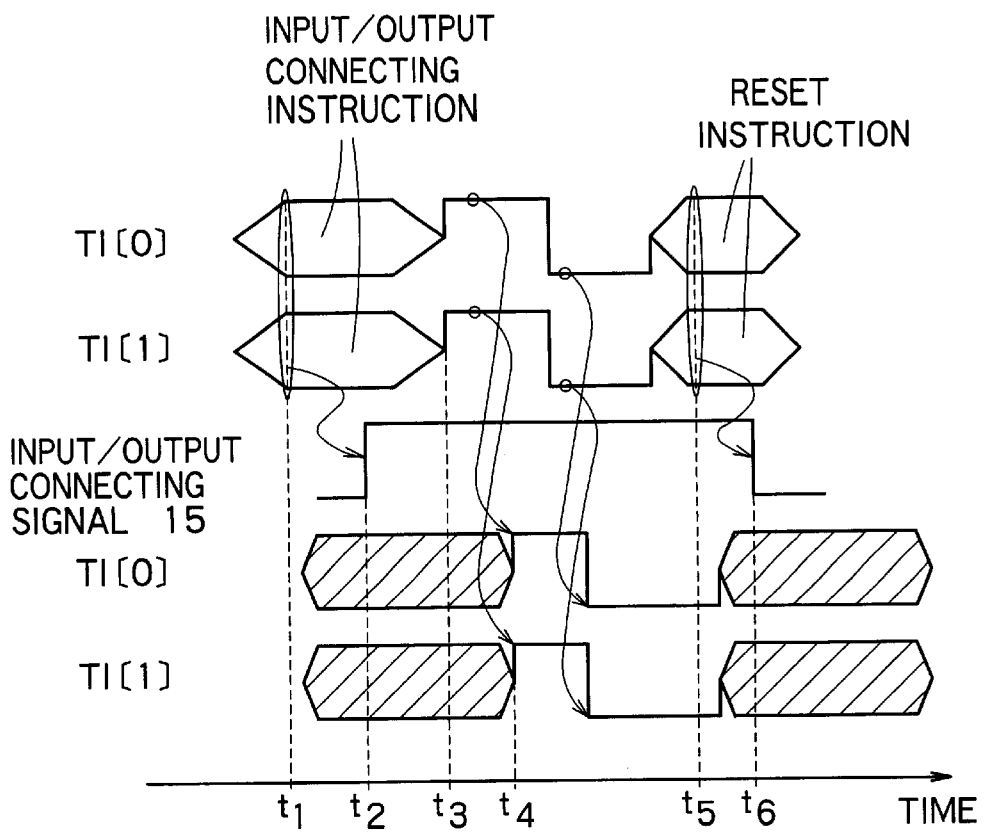
FIG. 2 is a timing chart for explaining the operation of the first preferred embodiment.
Figure 3:
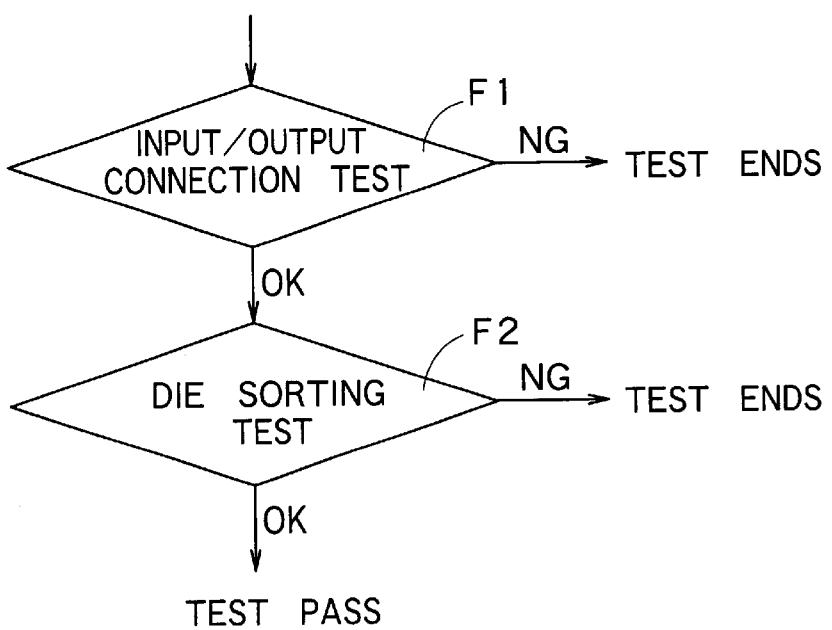
FIG. 3 is a flow chart showing a test procedure for the first preferred embodiment of a memory-embedded semiconductor integrated circuit device according to the present invention.

Referring to FIGS. 2 and 3, the operation of the first preferred embodiment of a memory-embedded semiconductor integrated circuit device according to the present invention will be described below. In order to simplify explanation, it is assumed that signals inputted to the test input terminal group 20 are 2-bit signals TI[0] and TI[1], and signals outputted from the test output terminal group 21 are 2-bit signals TO[0] and TO[1].

First, the signals TI[0] and TI[1] indicative of an input/output connecting instruction for activating the input/output connecting signal 15 are inputted from the tester (not shown) to the test input terminal group 20 (see time $t_1$ in FIG. 2). Then, the signals TI[0] and TI[1] are fed to the test signal generator 14 via the test input wire 23, and the activated input/output connecting signal 15 is outputted from the test signal generator 14 (see time $t_2$ in FIG. 2). When the switching circuit 16 receives the activated input/output connecting signal 15, the switching circuit 16 operates so as to select a signal which is inputted from the test input terminal group 20. In this state, when the signals TI[0] and TI[1] indicative of a test command are inputted from the tester (not shown) to the test input terminal group 20 (see time $t_3$ in FIG. 2), the signals TI[0] and TI[1] are inputted to the switching circuit 16 via the test input wire 23 to be outputted directly from the switching circuit 16. The output of the switching circuit 16 is outputted from the test output terminal group 21 via the test output wire 24 (see time $t_4$ in FIG. 2). At this time, if any one of the test input wire 23, switching circuit 16 and test output wire 24 is not defective, the signals TO[0] and TO[1] outputted from the test output terminal group 21 meet TO[0]=TI[0] and TO[1]=TI[1] to be coincident with the test command. If it is defective, the values of the signals TO[0] and TO[1] are different from the values of the signals TI[0] and TI[1]. Finally, when signals TI[0] and TI[1] indicative of a reset instruction are inputted from the tester (not shown) to the test input terminal group 20 (time $t_5$ in FIG. 2), the test signal generator 14 causes the input/output connecting signal 15 to be in an inactive state (time $t_6$ in FIG. 2). Thus, the input/output connection test ends.

When the memory macro 5 is tested, a test command, which does not activate the input/output connecting signal 15, may be used. When such a test command is inputted to the test input terminal group 20, the test command is decoded by the test signal generator 14 to be fed to the memory macro 5 as a test signal 17a which serves to carry out the test operation of the memory macro 5. Then, a test data output 17b indicative of the test result is fed from the memory macro 5 to the test output terminal group 21 via the switching circuit 16 and the test output wire 24. Thus, it is possible to examine whether the memory macro 5 is defective.

As described above, according to this preferred embodiment, a test input signal propagating through the test input wire 23 can be outputted from the test output terminal group 21 via the switching circuit 16 and the test output wire 24. Therefore, it is possible to rapidly determine whether the memory macro 5 is defective or the test circuit 10 and the wires 23, 24 other than the memory macro 5 are defective, so that it is possible to shorten the time required to analyze the test. Thus, it is possible to shorten the test time.

Furthermore, in the above described first preferred embodiment and in the second, third and sixth preferred embodiments which will be described later, all of the values of the test input signals inputted to the test input terminal group are preferably "H" or "L". Thus, even if the test input wire is erroneously connected to the combination of the test input terminal group, the test input signal can be outputted from the test output terminal group via the switching circuit and test output wire, so that it is possible to find the erroneous connection of the test input wire to the test input terminal group.

Usually, the test signal generator 14, the switching circuit 16, the test input wire 23 and the test output wire 24 are automatically arranged and wired by a computer.

Therefore, there are some cases where the wiring drawn as a straight line in FIG. 1 is a wound wiring in practice. Moreover, all of the n test input wires 23 do not always have the same length. That is, there are some cases where the n test input wires 23 have different wiring delays. For that reason, a skew is produced between the wires. However, in this preferred embodiment, the test input signal propagating through the test input wire 23 is designed to be inputted to the switching circuit 16 from a position, at which there is no influence of the skew due to the wiring delay of the test input wire 23. That is, the test input wire 23 is inputted to the switching circuit 16 immediately after being inputted to the test circuit 10. Therefore, since it is possible to prevent test failure from being caused by the skew, it is possible to carry out a reliable test. At this time, it is also possible to carry out tests at various timings in inputting the test input signal to the test input terminal group 20.

In the above described preferred embodiment, the test input signal is designed to be fed from the test input wire 23 directly to the switching circuit 16. However, the test input signal may be fed from the test input wire 23 to the switching circuit 16 via, e.g., a buffer (not shown).

The test procedure for the first preferred embodiment of a memory-embedded semiconductor integrated circuit device according to the present invention is shown in FIG. 3. First, as show at step F1 in FIG. 3, the above described input/output connection test is carried out. That is, the input/output connecting signal 15 is activated to carry out a test whether there are defects between the input terminal group 20 or the output terminal group 21 and the memory macro 5. If defects are found (i.e., in the case of NG), it is determined that the above described memory-embedded semiconductor integrated circuit device (chip) is defective, and the test ends. If any defects are not found (i.e., in the case of OK), a usual die sorting test, i.e., a test of the memory macro 5 while the input/output connecting signal 15 is in an inactive state, is carried out as shown at step F2 in FIG. 3. At this time, if defects are found (i.e., in the case of NG), it is determined that the memory macro 5 is defective, and the test ends. If any defects are not found (i.e., in the case of OK), it is determined that the memory macro 5 is non-defective, and the next step, such as assembly, is carried out. Thus, it is not required to test the semiconductor integrated circuit device (chip) which has defects between the input terminal group 20 or the output terminal group 21 and the memory macro 5, so that the test time can be reduced.

Figure 4:
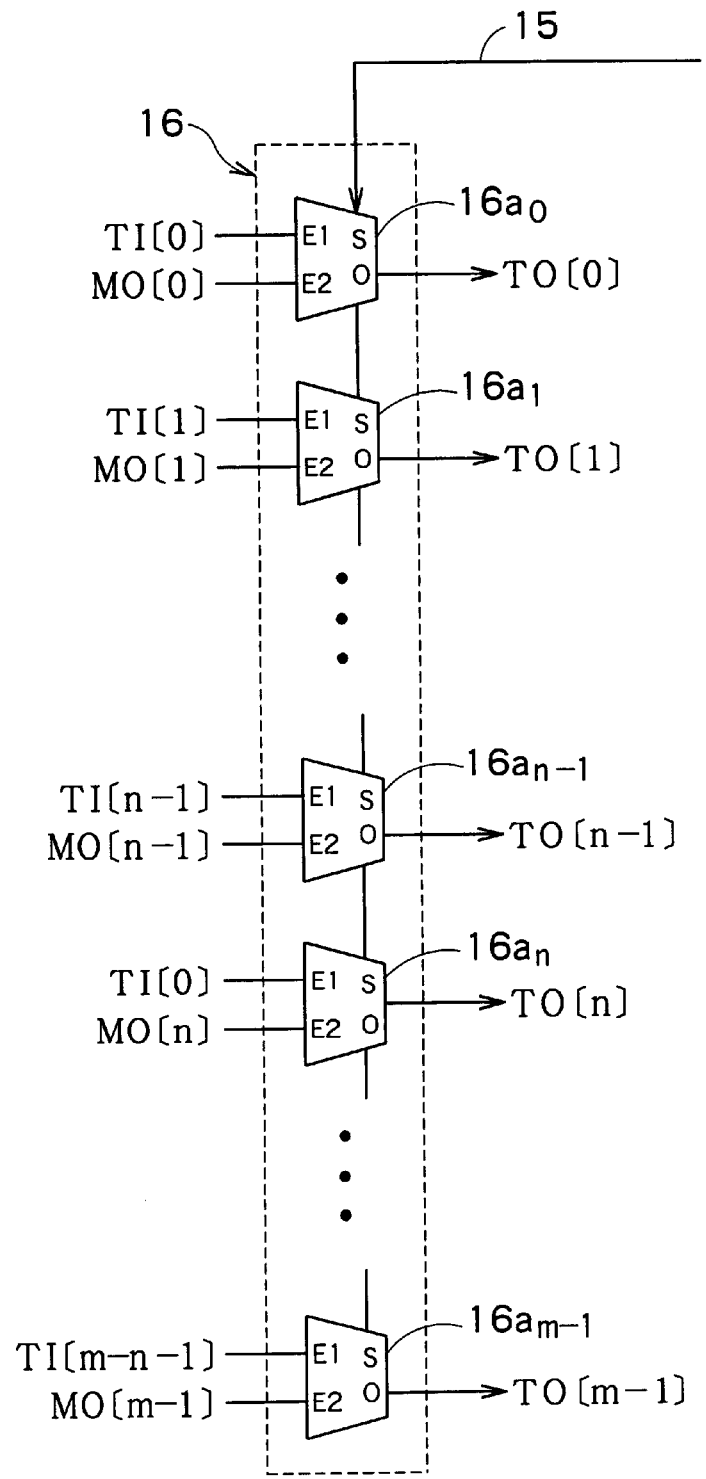
FIG. 4 is a circuit diagram showing the construction of a concrete example of a switching circuit of a memory-embedded semiconductor integrated circuit device according to the present invention.

Then, the construction of a first concrete example of a switching circuit 16 of the first preferred embodiment of a memory-embedded semiconductor integrated circuit device according to the preset invention is shown in FIG. 4. In this example, the switching circuit 16 is used when the relationship between the number n of the test input terminals included in the test input terminal group 20 and the number m of the test output terminals included in the test output terminal group 21 meets $m \leq 2n \leq 2m$.

In this first example, the switching circuit 16 has m multiplexers $16a_0, \ldots, 16a_m$. It is now assumed that n bit values of the test command inputted to the input terminal group 20 are TI[0], ..., TI[n−1], that m bit values of the test data output 17b outputted from the memory macro 5 are MO[0], ..., MO[m−1], and that m bit values of the signal outputted from the switching circuit 16 are TO[0], ..., T[m−1]. The multiplexers $16a_i$ (i=0, ..., n−1) receive a bit value TI[i] at an input terminal E1, a bit value MO[i] at an input terminal E2, and an input/output connecting signal 15 at an S terminal, and output a signal TO[i] from an output terminal. Then, the multiplexers $16a_i$ (i=0, ..., n−1) select the bit value TI[i] of the inputted two bit values TI[i] and MO[i] when the input/output connecting signal 15 is in an active state, and the bit value MO[i] when it is in an active state, and output the selected bit value as a signal TO[i].

In addition, the remaining multiplexers $16a_i$ (i=n, ..., m−1) receive a bit value TI[i−n] at an input terminal E1, a bit value MO[i] at an input terminal E2, and an input/output connecting signal 15 at an S terminal, and output a value TO[i] from an output terminal. Then, the remaining multiplexers $16a_i$ (i=n, ..., m−1) select the bit value TI[i] of the inputted two bit values TI[i−n] and MO[i] when the input/output connecting signal 15 is in an active state, and the bit value MO[i] when it is in an active state, and output the selected bit value as a signal TO[i].

Figure 5:
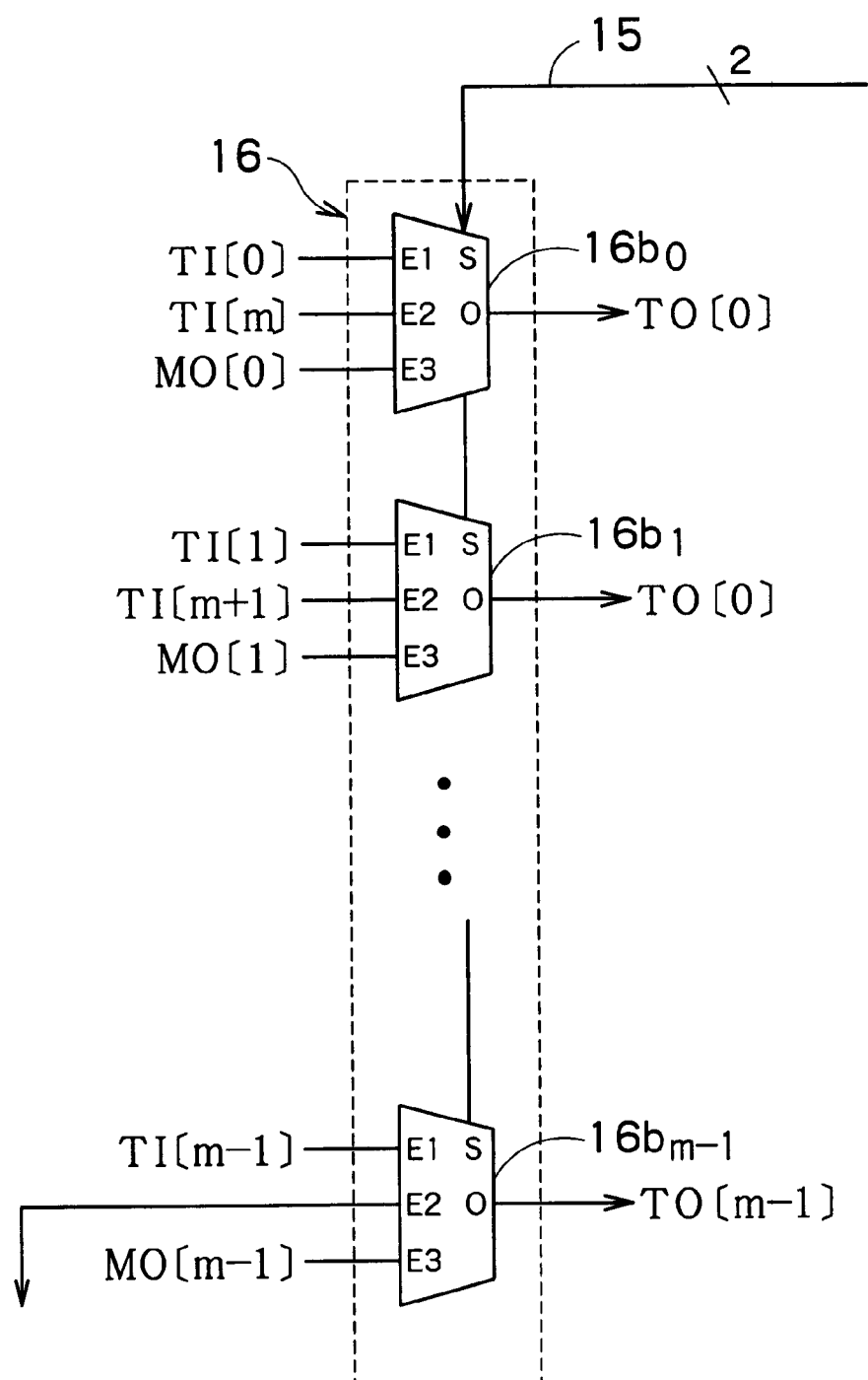
FIG. 5 is a circuit diagram showing the construction of another concrete example of a switching circuit.

Then, the construction of a second concrete example of a switching circuit 16 of the first preferred embodiment of a memory-embedded semiconductor integrated circuit device according to the preset invention is shown in FIG. 5. This switching circuit 16 is used when m≦n≦2m, and has m multiplexers $16b_0, \ldots, 16b_{m-1}$.

The multiplexers $16b_i$ (i=0, ..., n−m−1) receive a bit value TI[i] at an input terminal E1, a bit value TI[m+i] at an input terminal E2, a bit value MO[i] at an input terminal E3, and a 2-bit input/output connecting signal 15 at an S terminal, and output a value TO[i] from an output terminal. Assuming that the bit values of the 2-bit input/output connecting signal 15 are 15[0] and 15[1], respectively, the multiplexers $16b_i$ (i=0, ..., n−m−1) select the TI[i]when the 15[0] is in an active state (15[0]="H"), the TI[m+i] when the 15[1] is in an active state (15[1]="H"), the MO[i] when both of the 15[0] and 15[1] are in the active state, and output the selected bit value as a signal To[i]. Furthermore, it is assumed that the state that both of the 15[0] and 15[1] have "H" is inhibited.

In addition, the remaining multiplexers $16b_i$ (i=n−m, ..., m−1) receive a bit value TI[i] at an input terminal E1, a bit value MO[i] at an input terminal E3, an optional signal, e.g., a bit signal TI[i], at an input terminal, and a 2-bit input/output connecting signal 15 of 15[0] and 15[1] at an S terminal, and output a bit value TO[i] from an output terminal. Then, the remaining multiplexers $16b_i$ (i=n−m, ..., m−1) select the bit value inputted to the input terminal E1 when the 15[0] is in an active state, the bit value inputted to the input terminal E2 when the 15[1] is in an active state, and the bit value inputted to the input terminal E3 when both of the 15[0] and 15[1] are in the active state, and output the selected bit value as a TO[i].

Then, the detailed construction of the test signal generator 14 of the first preferred embodiment of a memory-embedded semiconductor integrated circuit device according to the present invention is shown in FIG. 6. In order to simplify explanation, it is assumed that signals indicative of a test command fed from the test input terminal group 20 are 3-bit signals TI[0], TI[1] and TI[2]. In addition, only the function of decoding these signals TI[0], TI[1] and TI[2] to generate an input/output connecting signal 15 is shown in FIG. 6. That is, the construction for decoding the test command to obtain a test signal 17a is omitted from FIG. 6.

The test signal generator 14 shown in FIG. 6 comprises NAND gates 14a and 14b, and an RS latch circuit 14c. In the RS latch circuit 14c, a signal, which is outputted from a Q terminal when the input signals to an $S_n$ terminal and $R_n$ terminal have "L" and "H", respectively, has "H", a signal, which is outputted from the Q terminal when the input signals to the $S_n$ terminal and $R_n$ terminal have "H" and "L", respectively, has "L", and a signal, which is outputted from the Q terminal when the input signals to the $S_n$ terminal and $R_n$ terminal have "H" and "H", respectively, is a signal holding the last value. Furthermore, the input signals to the $S_n$ terminal and $R_n$ terminal are inhibited from having "L" and "L", respectively.

Now, a test command to activate the input/output connecting signal 15 outputted from the Q terminal of the RS latch circuit 14c has TI[0]="L", TI[1]="H" and TI[2]="L". When this test command is inputted to the test signal generator 14, the output of the NAND gate 14a has "L" and the output of the NAND gate has "H", so that the input/output connecting signal 15 outputted from the RS latch circuit is activated.

In addition, a test command to return the state of the input/output connecting signal 15 to the inactive state has TI[0]="H", TI[1]="H" and TI[2]="L". If this test command is inputted to the test signal generator 14, the output of the NAND gate 14a has "H" and the output of the NAND gate 14b has "L", so that the input/output connecting signal 15 outputted from the RS latch circuit 14c has "L" to be in the inactive state.

Furthermore, the memory macro 5 of the memory-embedded semiconductor integrated circuit device 1 in this preferred embodiment may be synchronous or asynchronous.

(Second Preferred Embodiment)

Figure 7:
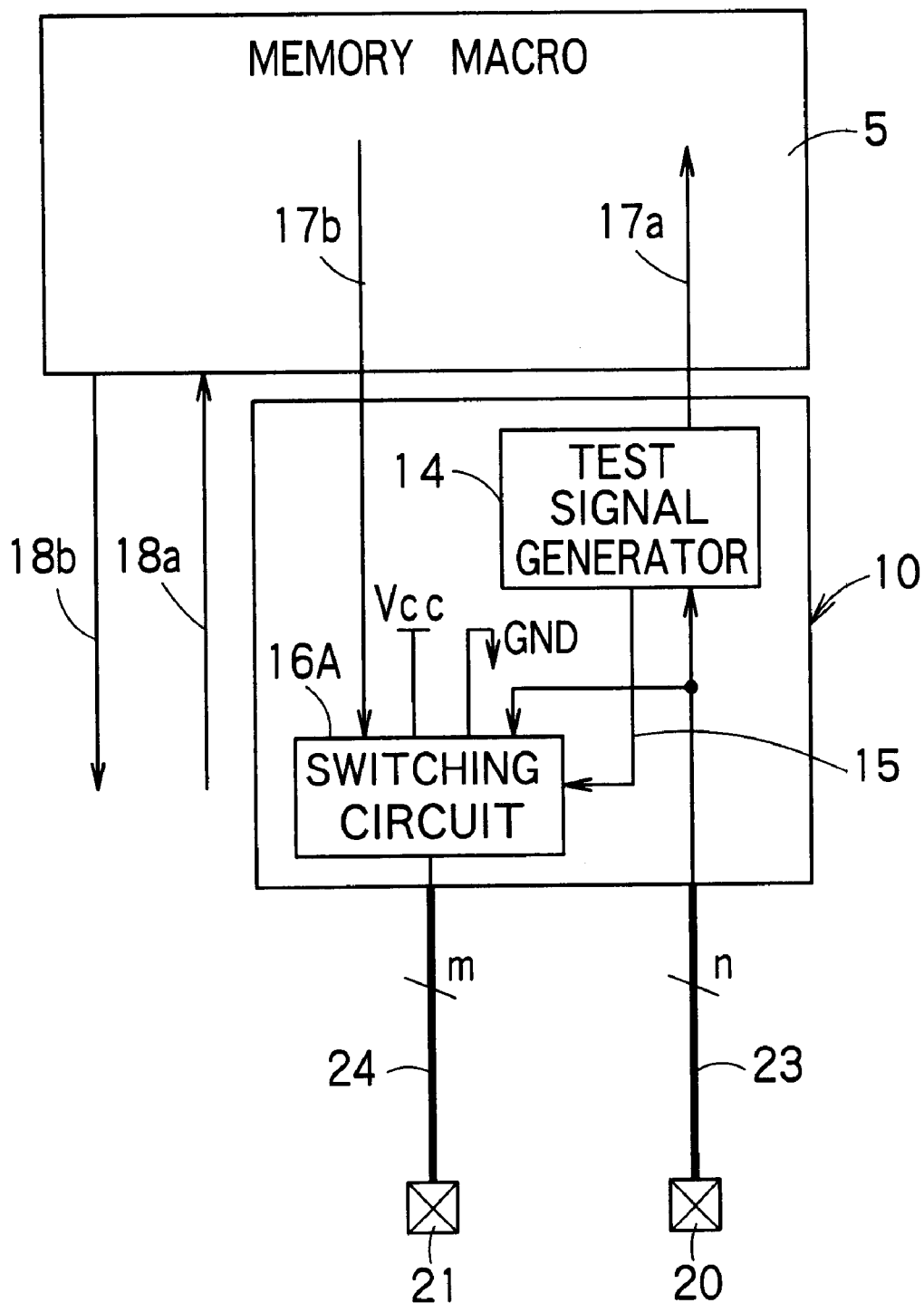
FIG. 7 is a block diagram showing the construction of the second preferred embodiment of the present invention.

The construction of the second preferred embodiment of a memory-embedded semiconductor integrated circuit device according to the present invention is shown in FIG. 7. In this second preferred embodiment, the memory-embedded semiconductor integrated circuit device has the same construction as that in the first preferred embodiment shown in FIG. 1, except that the switching circuit 16 is replaced with a switching circuit 16A.

To this switching circuit 16A, the following four kinds of input signals are inputted:

a) a test signal inputted from a tester (not shown) via the test input terminal group 20;

b) a power supply voltage Vcc signal having "H" level;

c) a ground voltage GND signal having "L" level; and d) a test data output fed from a memory macro 5.

The switching circuit 16A is designed to select one kind of input signal from the four kinds of inputs in accordance with the input/output connecting signal 15 fed from the test signal generator 14, and to output the selected input signal to the test output terminal group 21 via the test output wire 24. For example, assuming that the input/output connecting signal 15 is a 3-bit signal and signals indicative of the bit values thereof are signals 15[0], 15[1] and 15[2], the a test signal inputted via the test input terminal group 20 is selected when the signal 15[0] is in an active state, the power supply voltage Vcc signal is selected when the signal 15[1] is in an active state, the ground voltage GND signal is selected when the signal 15[2] is in an active state, and the test data output fed from the memory macro 5 is selected when all of the three signals 15[0], 15[1] and 15[2]are not in the active state.

Figure 8:
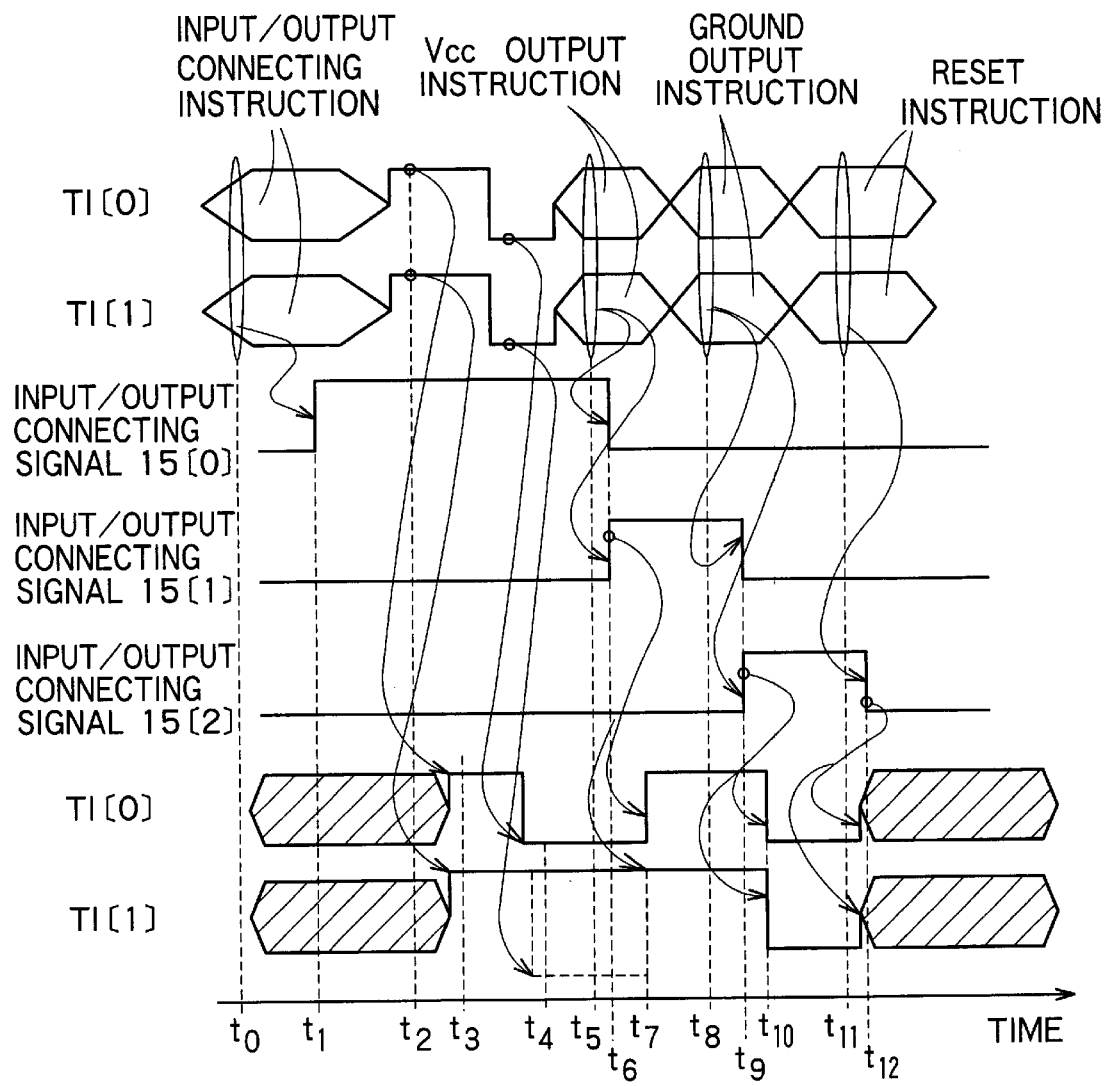
FIG. 8 is a timing chart for explaining the operation of the second preferred embodiment.

Referring to FIG. 8, the operation of the second preferred embodiment will be described below. In order to simplify explanation, it is assumed that a test command inputted via the test input terminal group 20 has 2-bit signals TI[0] and TI[1] and signals outputted from the test output terminal group 21 are 2-bit signals TO[0] and TO[1].

As shown in FIG. 8, if an input/output connecting instruction is inputted to the test input terminal group 20 at time $t_0$, a signal 15<0> of the input/output connecting signals 15 outputted from the test signal generator 14 is activated at time $t_1$. Thereafter, if test data are inputted from the tester (not shown) via the test input terminal 20 at time $t_2$, the test data are selected by the switching circuit 16 to be outputted from the test output terminal group 21 at time $t_3$. At this time, if the test input wire 23, test circuit 10 and test output wire 24 are not defective, the TO[0] and TO[1] outputted from the test output terminal group 21 are coincident with the signals TI[0] and TI[1] inputted to the test input terminal group 20, respectively.

On the other hand, for example, if the signal TO[1] is not coincident with the inputted signal TI[1] although the signal TO[0] is coincident with the inputted signal TI[0] as shown at time t4 in FIG. 8, any one of the test input wire 23, test circuit 10 and test output wire 24 is defective. In this case, if a Vcc output instruction for causing the 15[0] of the input/output connecting signals 15 to be in an inactive state and causing the signal 15[1] to be in an active state is inputted to the test input terminal group 20 in order to identify which is defective (see time $t_5$), the test signal generator 14 causes the signal 15 [0] to be in the inactive state and the signal 15[1] to be in the active state (see time $t_6$). Then, both of the TO[0] and TO[1] have "H" level (see time $t_7$ in FIG. 8).

Then, if a ground output instruction is inputted to the test input terminal group 20 (see time $t_8$), the test signal generator 14 causes the signal 15[1] to be in an inactive state and the signal 15[2] to be in an active state (see time $t_9$). Then, both of the TO[0] and TO[1] have "L" level (see time $t_{10}$ in FIG. 8). Then, if a reset instruction for completing the input/output connecting test is inputted to the test input terminal group 20 (see time $t_{11}$), all of the input/output connecting signals 15 are caused to be in the inactive state (see time $t_{12}$), so that the input/output connecting test is completed. In this case, when the Vcc output instruction and the ground output instruction are inputted, i.e., when the test input wire 23 is not used other than when the above described instructions are inputted, no defects are found, and when the test data are inputted via the test input wire 23, defects are found, so that it is presumed that the defects are caused by the test input wire 23. If the test output wire 24 is defective, defects are also found when the Vcc output instruction or the ground output instruction is inputted.

As described above, it is possible to easily examine which of the test input wire 23 and the test output wire 24 is defective, so that it is possible to shorten the time required to analyze the test. Thus, it is possible to shorten the test time.

Also in this second preferred embodiment similar to the first preferred embodiment, the test input signal propagating through the test input wire 23 can be outputted from the test output terminal group 21 via the switching circuit 16A and the test output wire 24. Therefore, it is possible to rapidly determine whether the memory macro 5 or a portion other than the memory macro 5 is defective, so that it is possible to further shorten the time required to carry out the test analysis.

In addition, similar to the above described first preferred embodiment, the test input signal propagating through the test input wire 23 is designed to be inputted to the switching circuit 16A from a position, at which there is no influence of the skew due to the wiring delay of the test input wire 23. That is, the test input wire 23 is inputted to the switching circuit 16A immediately after being inputted to the test circuit 10. Therefore, it is possible to prevent test failure from being caused by the skew, so that it is possible to carry out a reliable test. At this time, it is also possible to carry out tests at various timings in inputting the test input signal.

Similar to the above described first preferred embodiment, the test input signal may fed from the test input wire 23 to the switching circuit 16A via, e.g., a buffer (not shown).

Furthermore, when the memory macro 5 is tested in the second preferred embodiment, the input/output connecting signal 15 is caused to be in an inactive state, and the test command is inputted to the test input terminal group 20, similar to the first preferred embodiment.

Furthermore, the memory macro 5 of the memory-embedded semiconductor integrated circuit device 1 in this preferred embodiment may be synchronous or asynchronous.

(Third Preferred Embodiment)

The construction of the third preferred embodiment of a memory-embedded semiconductor integrated circuit device according to the present invention is shown in FIG. 9. In this third preferred embodiment, the memory-embedded semiconductor integrated circuit device is provided with a flip-flop circuit 12, which operates in synchronism with a clock is newly provided, in addition to the construction of the memory-embedded semiconductor integrated circuit device in the first preferred embodiment shown in FIG. 1. Although only one flip-flop circuit 12 is shown in the figure, the number of provided flip-flop circuits is equal to the number of test input terminals. This flip-flop circuit 12 incorporates a test command or test data in synchronism with a test clock, which is fed from a tester 40 via a lead wire 42, a probe card needle 43, a test clock input terminal 22 and a test clock input wire 25, and transmits the test command or test data to a test signal generator 14 and a switching circuit 16. Furthermore, the test command or test data are inputted from the tester 40 via a lead wire 42, the probe card needle 43, a test input terminal 20 and a test input wire 23.

In this preferred embodiment, a test is carried out by contacting the probe card needle 43 with each of the test input terminal group 20, the test output terminal group 21 and the test clock input terminal 22 to generate a test command from the tester 40. Similar to the first preferred embodiment, the test from the test input terminal group 20 and the test output terminal group 21 to the memory macro 5 is carried out by causing the input/output connecting signal 15, which is fed from the test signal generator 14 to the switching circuit 16, to be in an active state. In addition, similar to the first preferred embodiment, when the memory macro 5 is tested, the input/output connecting signal 15 is caused to be in an inactive state. Furthermore, the difference between the above described test and the test in the first preferred embodiment is that the test command is fed to the test signal generator 14 after being incorporated into the flip-flop 12 in synchronism with the test clock.

Thus, the test in the third preferred embodiment can be carried out similar to that in the first preferred embodiment.

As described above, in the third preferred embodiment, since the test command is incorporated in synchronism with the test clock, it is not required to take account of skews between test commands, so that it is possible to prevent the test circuit 10 from malfunctioning. In addition, also in the third preferred embodiment similar to the first preferred embodiment, the test input signal propagating through the test input wire 23 can be outputted from the test output terminal group 21 via the switching circuit 16 and the test output wire 24. Therefore, it is possible to rapidly determine whether the memory macro 5 or a portion other than the memory macro 5 is defective, so that it is possible to shorten the time required to carry out the test analysis. Thus, it is possible to shorten the test time.

Moreover, in the memory-embedded semiconductor integrated circuit device in the third preferred embodiment, it is possible to easily carry out a calibration, i.e., the determination of a setup time and hold time for a test input signal which is inputted to each of the terminals of the test input terminal group 20. Referring to FIGS. 10 through 13, this calibration method will be described below.

In order to simplify the following description, it is assumed that the test command or test data inputted from the test input terminal group 20 have 2-bit signals TI[0] and TI[1], and the test data output, which are outputted from the test output terminal group 21, has 2-bit signals TO[0] and TO[1].

Figure 10:
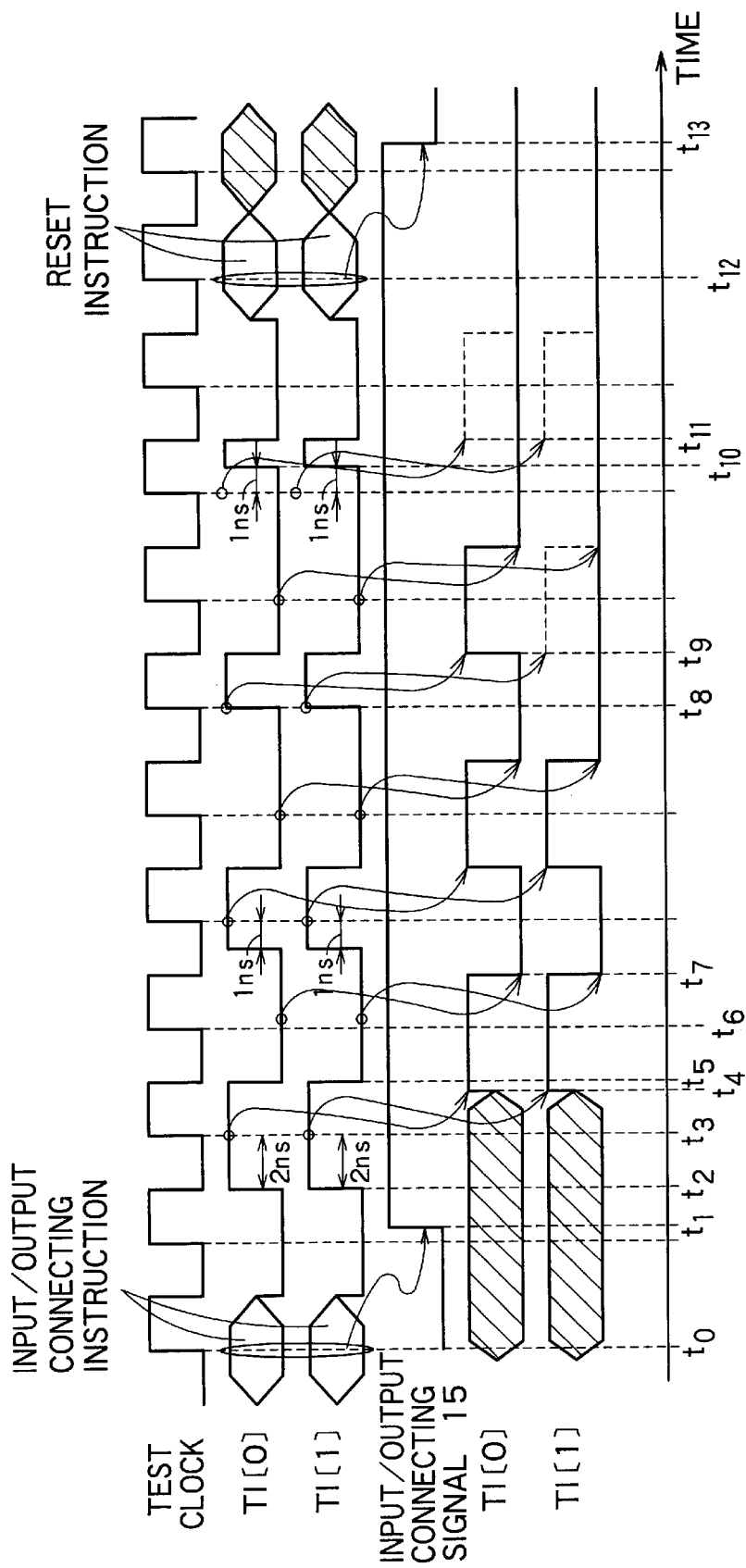
FIG. 10 is a timing chart for explaining a method for deriving a setup time using the third preferred embodiment of a memory-embedded semiconductor integrated circuit device according to the present invention.

Referring to FIG. 10, a method for determining a setup time on the "H" side will be described below.

First, a test command for causing the input/output connecting signal 15 to be in an active state is transmitted from the tester 40 to the test input terminal group 20 in synchronism with the test clock inputted to the test clock input terminal 22(see time $t_0$ in FIG. 10). Then, the test command is incorporated into the flip-flop 12 in synchronism with the test clock to be fed to the test signal generator 14. Then, at the rising of the next test clock, the test signal generator 14 causes the input/output connecting signal 15 to be in an active state ("H" state in this preferred embodiment) (see time $t_1$). In this state, the signal outputted from the switching circuit 16 to the test output terminal group 21 via the test output wire 24 becomes a signal, which is inputted from the test input terminal group 20 to the switching circuit 16 via the test input wire 23 and the flip-flop circuit 12 if the test circuit or the like is not defective. Therefore, from the rising of the first test clock after the input/output connecting signal 15 is in an active state, data inputted to the test input terminal group 20 are outputted directly to the test output terminal group 21.

First, at a setup timing in allowing a sure input (during 2 ns before time $t_3$ in FIG. 10), the signals TI[0] and TI[1] inputted to the test input terminal group 20 are caused to have "H" and "H" levels, respectively (see time $t_2$). These signals are incorporated into the flip-flop 12 at the next rising of the test clock (see time $t_3$), so that the signals TO[0] and TO[1] outputted from the test output terminal group 21 in the cycle come to have "H" and "H" levels, respectively (see time $t_4$). Thereafter, at a hold timing in carrying out a sure input at the next rising of the test clock (during 2 ns (not shown) before time $t_6$ in FIG. 10), the signals TI[0] and TI[1] are caused to have "L" and "L" levels, respectively (see time $t_5$). These signals are incorporated into the flip-flop 12 at the next rising of the test clock (see time $t_6$), and the signals TO[1] and TO[1] come to have "L" and "L" levels, respectively, in the cycle (see time $t_7$).

Subsequently, the setup timing is delayed by a predetermined time (1 ns in FIG. 10) to repeat the above described steps. Furthermore, it is assumed that the holding timing in changing the "H" and "H" levels of the signals TI[0] and TI[1] to the "L" and "L" levels, respectively, is not changed to be a timing in carrying out a sure input (2 ns in FIG. 10). Thus, the output signals TO[0] and TO[1] come to have the "L" and "L" levels once, respectively. Therefore, when the "H" levels of the input signals TI[0] and TI[1] do not come to be inputted, i.e., when the output signals TO[0] and TO[1] do not come to have the "H" level, the setup time before one step becomes the setup time on the "H" side. In FIG. 10, if the "H" level of the signal TI[1] is inputted simultaneously with the rising of the test clock (see time $t_8$), the signal TI[1] does not come to be incorporated into the flip-flop 12 (see time $t_9$), so that it is found that the setup time on the "H" side of the signal TI[1] requires 1 ns. In addition, if the signal TI[0] is delayed from the test clock by 1 ns, the signal TI[0] does not come to be incorporated into the flip-flop 12 (see times $t_{10}$ and $t_{11}$), so that it is found that the setup time on the "H" side of the signal TI[0] is 0 ns. Therefore, it is required to more early the signal TI[1] than the test clock by 1 ns.

Finally, if a reset instruction is inputted to the test input terminal group 20 at time $t_{12}$, the reset instruction is incorporated into the flip-flop 12 at the next rising of the test clock, so that the input/output connecting signal 15 outputted from the test signal generator 14 comes to be in an inactive state (see time $t_{13}$). Thereafter, the memory macro 5 can be tested.

Figure 11:
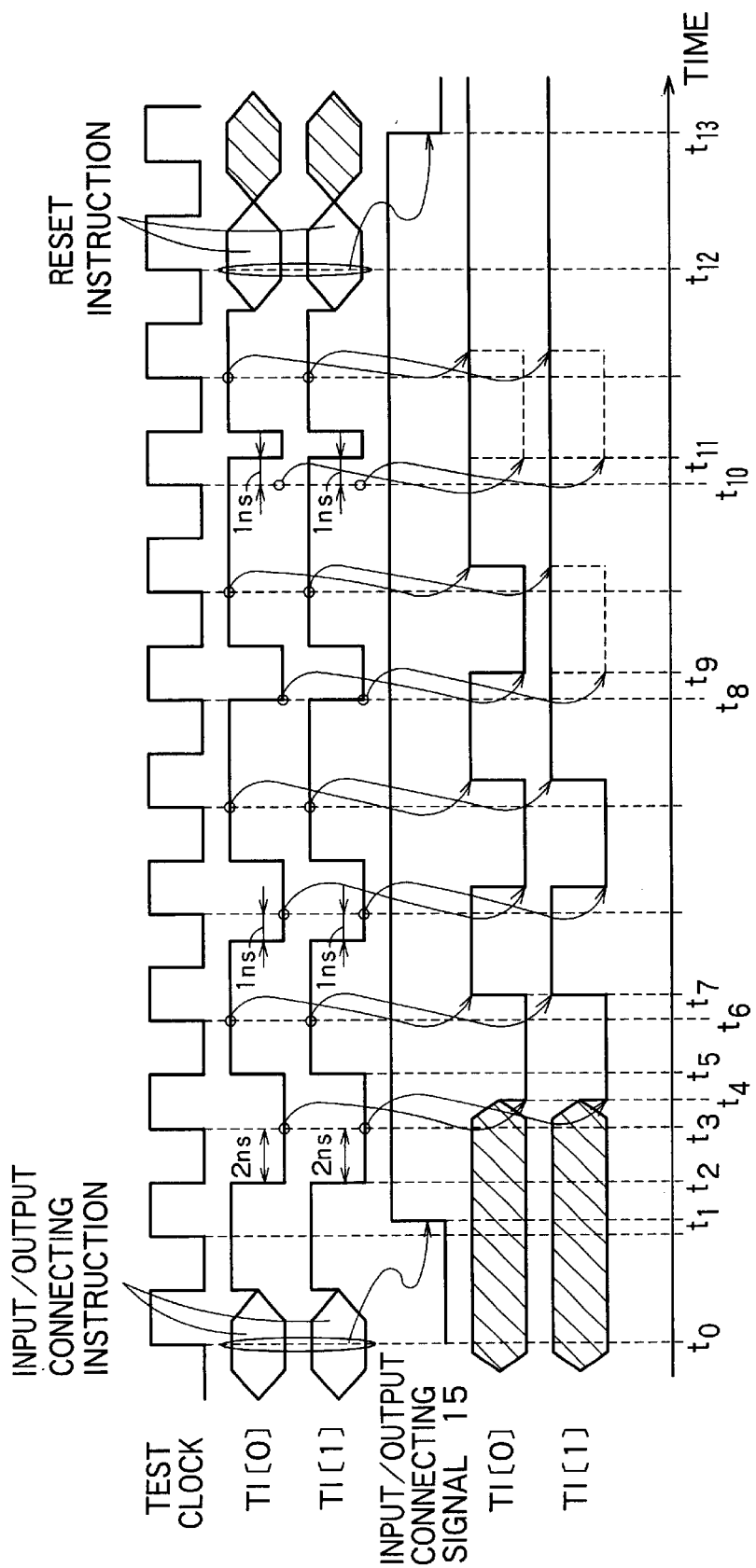
FIG. 11 is a timing chart for explaining a method for deriving a setup time using the third preferred embodiment of a memory-embedded semiconductor integrated circuit device according to the present invention.

Referring to FIG. 11, a method for determining a setup time on the "L" side will be described below.

First, a test command (an input/output connecting instruction) for causing the input/output connecting signal to be in an active state is inputted to the test input terminal group 20 (see time $t_0$ in FIG. 11), to cause the input/output connecting signal 15 to be in an active state (see time $t_1$).

Subsequently, at a setup timing in allowing a sure input (during 2 ns before time $t_3$ in FIG. 11), the input signals TI[0] and TI[1] are caused to have "L" and "L" levels, respectively (see time $t_2$). These signals are incorporated at the next rising of the test clock (see time $t_3$), and the output signals TO[0] and TO[1] come to have "L" and "L" levels, respectively, in the cycle (see time $t_4$). Thereafter, at a hold timing in carrying out a sure input at the next rising of the test clock (during 2 ns (not shown) before $t_6$ in FIG. 11), the signals TI[1] and TI[1] are caused to have "H" and "H" levels, respectively (see time $t_5$). These signals are incorporated into the flip-flop 12 at the next rising of the test clock (see time $t_6$), and the signals TO[0] and TO[1] come to have "H" and "H" levels, respectively, in the cycle (see time $t_7$).

Subsequently, the setup timing is delayed by a predetermined time (1 ns in FIG. 11) to repeat the above described steps. Thus, the output signals TO[0] and T[1] come to have "H" and "H" levels once, respectively. Therefore, when the "L" levels of the input signals TI[0] and TI[1] do not come to be inputted, i.e., when the output signals TO[0] and TO[1] do not come to have the "L" level, the setup time before one step becomes the setup time on the "L" side. In FIG. 11, if the "L" level of the signal TI[1] is inputted simultaneously with the rising of the test clock (see time $t_8$), the signal TI[1] does not come to be incorporated into the flip-flop 12 (see time $t_9$), so that it is found that the setup time on the "L" side of the signal TI[1] requires 1 ns. In addition, if the signal TI[0] is delayed from the test clock by 1 ns, the signal TI[0] does not come to incorporated into the flip-flop 12 (see times $t_{10}$ and $t_{11}$), so that it is found that the setup time on the "L" side of the signal TI[0] is 0 ns.

Finally, if a reset instruction is inputted to the test input terminal group 20 at time $t_{12}$, the reset instruction is incorporated into the flip-flop 12 at the next rising of the test clock, so that the input/output connecting signal 15 outputted from the test signal generator 14 comes to be in an inactive state (see time $t_{13}$). As can be seen from FIGS. 10 and 11, the setup time is 0 ns for the signal TI[0] and 1 ns for the signal TI[1]. Therefore, when the signal is inputted from the tester 40, the setup time is set to be 0 ns for the signal TI[0] and 1 ns for the signal TI[1].

Figure 12:
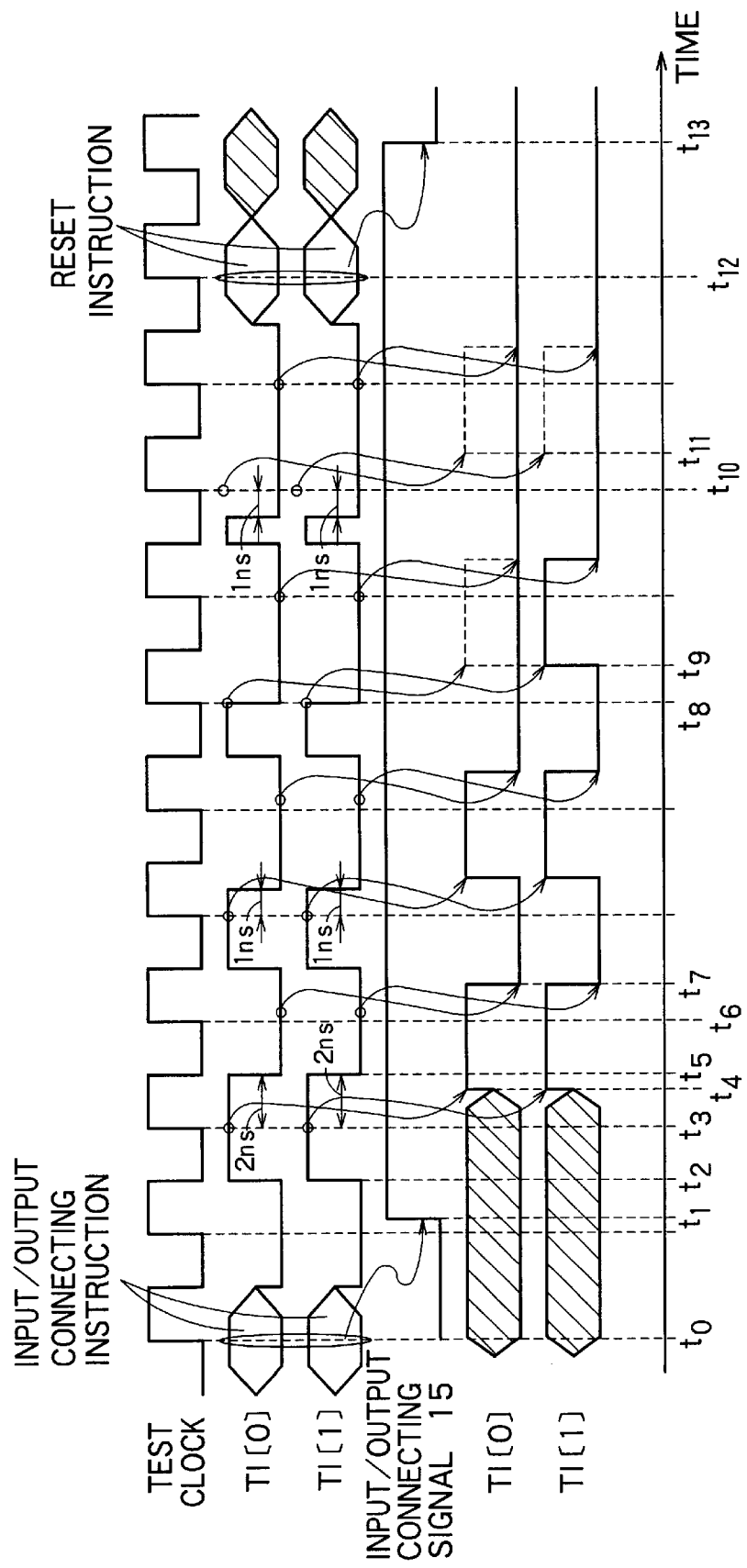
FIG. 12 is a timing chart for explaining a method for deriving a hold time in the third preferred embodiment.

Referring to FIG. 12, a method for determining a hold time on the "H" side will be described below.

First, an input/output connecting instruction for causing the input/output connecting signal 15 to be in an active state is inputted to the test input terminal group 20 (see time $t_0$ in FIG. 12), to cause the input/output connecting instruction 15 to be in an active state (see time $t_1$).

Subsequently, at a setup timing in allowing a sure input (during 2 ns before time $t_3$ in FIG. 12), the input signals TI[0] and TI[1] are caused to have "H" and "H" levels, respectively (see time $t_2$). These signals are incorporated into the flip-flop 12 at the next rising of the test clock (see time $t_3$), so that the output signals TO[0] and TO[1] come to have "H" and "H" levels, respectively, in the cycle (see time $t_4$).

Thereafter, at a hold timing in carrying out a sure input during the next rising of the test clock (during 2 ns (not shown) before time $t_6$ in FIG. 12), the signals TI[0] and TI[1] are caused to have "L" and "L" levels, respectively (see time $t_5$). These signals are incorporated into the flip-flop 12 at the next rising of the test clock (see time $t_6$), and the signals TO[1] and TO[1] come to have "L" and "L" levels, respectively, in the cycle (see time $t_7$).

Subsequently, the hold timing is delayed by a predetermined time (1 ns in FIG. 12) to repeat the above described steps. Thus, the output signals TO[0] and TO[1] come to have the "L" and "L" levels once, respectively. Therefore, when the "H" levels of the input signals TI[0] and TI[1] do not come to be inputted, i.e., when the output signals TO[0] and TO[1] do not come to have the "H" level, the hold time before one step becomes the hold time on the "H" side. In FIG. 12, the hold time on the "H" side of the signal TI[0] is 1 ns (see times $t_8$ and $t_9$), and the hold time on the "H" side of the signal TI[1] is 0 ns (see times $t_{10}$ and $t_{11}$).

Finally, if a reset instruction is inputted to the test input terminal group 20 at time $t_{12}$, this reset instruction is incorporated into the flip-flop 12 at the next rising of the test clock, so that the input/output connecting signal 15 outputted from the test signal generator 14 comes to be in an inactive state (see time $t_{13}$).

Figure 13:
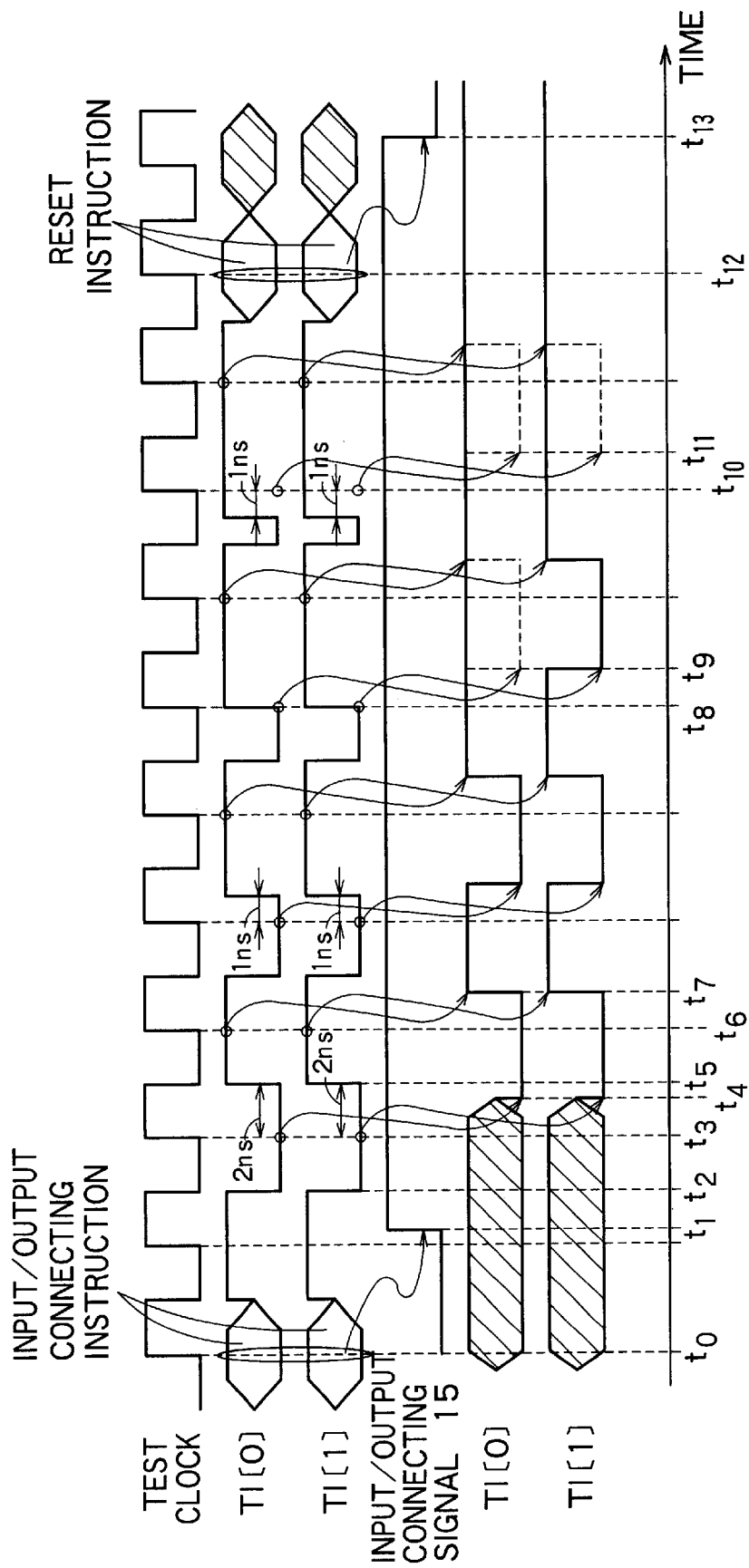
FIG. 13 is a timing chart for explaining a method for deriving a hold time in the third preferred embodiment.

Referring to FIG. 13, a method for determining a hold timing on the "L" side will be described below.

First, an input/output connecting instruction is inputted to the test input terminal group 20 (see time $t_0$ in FIG. 13), to cause the input/output connecting signal 15 to be in an active state (see time $t_1$).

Subsequently, at a setup timing in allowing a sure input (the setup time is 2 ns in FIG. 13), the input signals TI[0] and TI[1] are caused to have "L" and "L" levels, respectively (see time $t_2$). These signals are incorporated at the next rising of the test clock (see time $t_3$), and the output signals TO[0] and TO[1] come to have "L" and "L" levels, respectively, in the cycle (see time $t_4$).

Thereafter, at a hold timing in carrying out a sure input during the next rising of the test clock (the hold time is 2 ns in FIG. 31), the signals TI[1] and TI[1] are caused to have "H" and "H" levels, respectively (see time $t_5$). These signals are incorporated into the flip-flop 12 at the next rising of the test clock (see time $t_6$), and the signals TO[0] and TO[1] come to have "H" and "H" levels, respectively, in the cycle (see time $t_7$).

Subsequently, the hold timing is delayed by a predetermined time (1 ns in FIG. 13) to repeat the above described steps. Thus, the output signals TO[0] and T[1] come to have "H" and "H" levels once, respectively. Therefore, when the "L" levels of the input signals TI[0] and TI[1] do not come to be inputted, i.e., when the output signals TO[0] and TO[1] do not come to have the "L" level, the hold time before one step becomes the setup time on the "L" side. In FIG. 13, the hold time on the "L" side of the signal TI[0] is 1 ns (see times $t_8$ and $t_9$), and the hold time on the "L" side of the signal TI[1] is 0 ns (see times $t_{10}$ and $t_{11}$).

Finally, if a reset instruction is inputted to the test input terminal group 20 at time $t_{12}$, this reset instruction is incorporated into the flip-flop 12 at the next rising of the test clock, so that the input/output connecting signal 15 comes to be in an inactive state (see time $t_{13}$).

As can be seen from FIGS. 12 and 13, the hold time is 1 ns for the signal TI[0] and 0 ns for the signal TI[1]. Therefore, when the signal is inputted from the tester 40, the hold time is set to be 1 ns for the signal TI[0] and 0 ns for the signal TI[1].

Since the setup time and hold time of the test input signal can be set as described above, it is possible to easily carry out the calibration of the path to the entrance of the test circuit 10 every one terminal, so that it is possible to shorten the time required to carry out the test.

Referring to FIG. 14, the procedure for carrying out a fast test using the above described calibration will be described below.

First, using the method described referring to FIGS. 10 through 13 (see step F10 in FIG. 14), the skew values, i.e., the setup time and hold time, of each of the terminals are acquired (see step F11 in FIG. 14). This acquisition of the skew values is carried out every wafer or every lot. Then, the acquired skew values are incorporated as variables of the tester 40, and a signal having the skew values is used for carrying out a fast test (see step F12 in FIG. 14).

Thus, the above described calibration function can be used for carrying out a more accurate fast test.

Furthermore, in a case where the above described third preferred embodiment of a memory-embedded semiconductor integrated circuit device according to the present invention is tested, the lead wire 42 and the probe card needle 43 are used for connecting the terminal groups 20, 21 and 22 to the tester 40. In a case where the memory-embedded semiconductor integrated circuit device is sealed with a mold resin 28 as shown in FIG. 15, the lead wires 42 of the tester 40 may be connected to the outer terminals 29a, 29b and 29c which are connected to the respective terminal groups 20, 21 and 22 by means of bonding wires 26, respectively. In this case, since all of the lengths of the bonding wires 26 are the same, there is an advantage in that it is not required to take account of the skews between the tester 40 and the memory-embedded semiconductor integrated circuit device.

Furthermore, the memory macro 5 of the memory-embedded semiconductor integrated circuit device 1 in this preferred embodiment is suitably synchronous.

(Fourth Preferred Embodiment)

Figure 16:
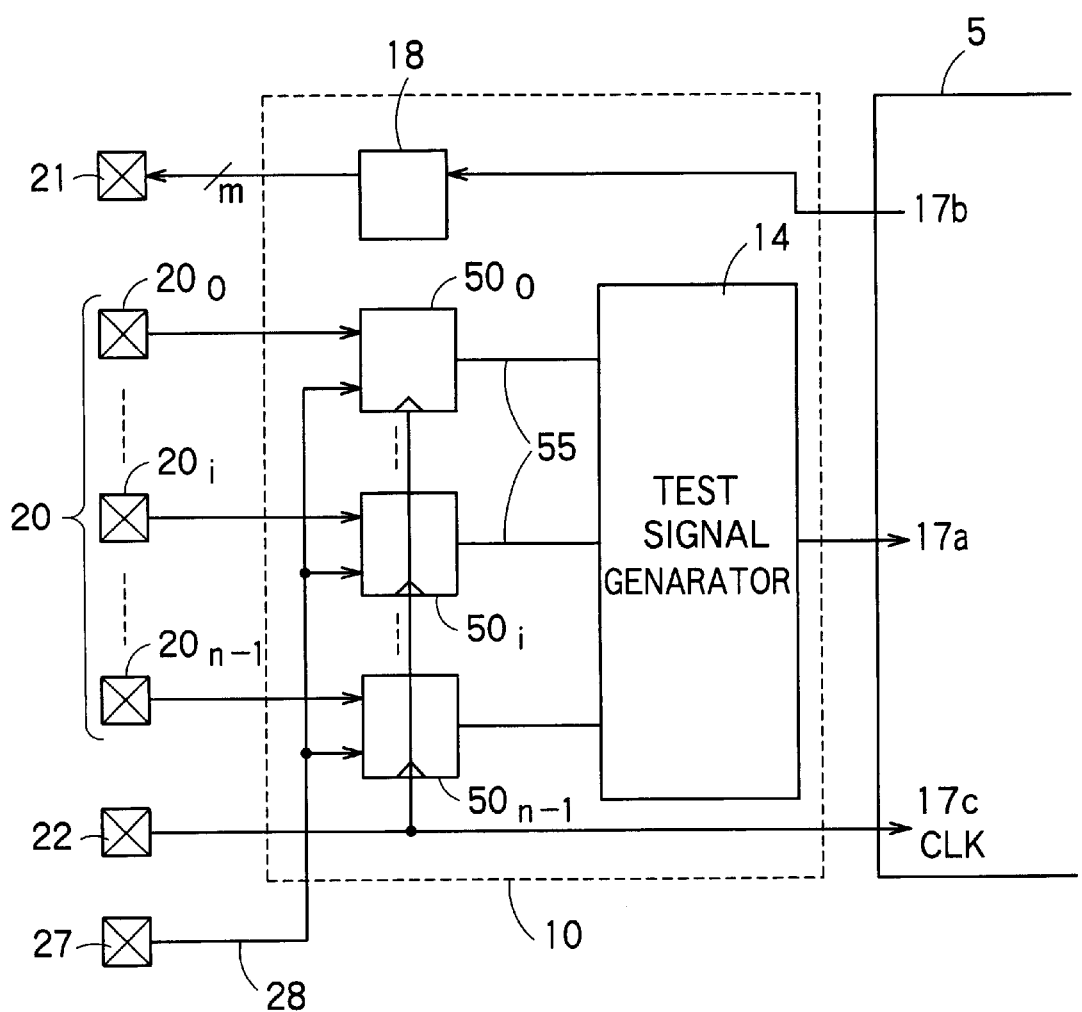
FIG. 16 is a block diagram showing the construction of the fourth preferred embodiment of the present invention.

The construction of the fourth preferred embodiment of a memory-embedded semiconductor integrated circuit device according to the present invention is shown in FIG. 16. In this fourth preferred embodiment, the memory-embedded semiconductor integrated circuit device comprises a logic part (not shown), a memory macro 5, a test circuit 10, a test input terminal group 20 of n test input terminals $20_0, \ldots, 20_{n-1}$, a test output terminal group 21 of m test output terminals, a CLK terminal 22 for inputting a clock signal CLK, and a control signal input terminal 27 for inputting a control signal 28.

Figure 17:
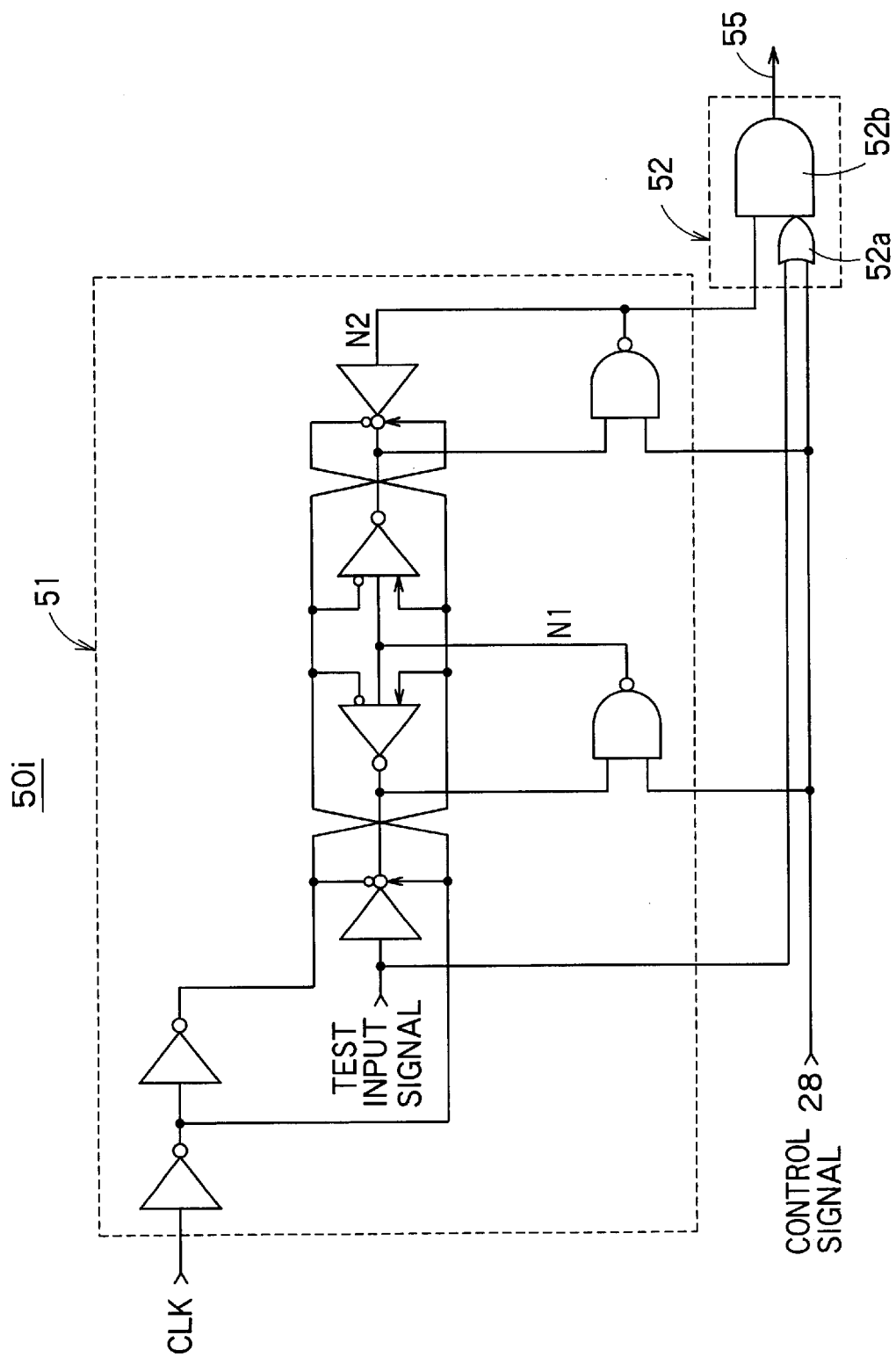
FIG. 17 is a circuit diagram showing a concrete example of a timing adjusting circuit for use in the fourth preferred embodiment.

The test circuit 10 comprises a timing adjusting circuit $50_0, \ldots, 50_{n-1}$, a test signal generator 14, and a test data output driver 18. The timing adjusting circuit $50_i$ (i=0, ..., n−1) is designed to either incorporate a test input signal (a test command or test data), which is fed via the test input terminal $20_i$, in synchronism with the clock signal CLK to output the test input signal after one clock, or output the test input signal immediately after incorporating the test input signal. For example, as shown in FIG. 17, the timing adjusting circuit $50_i$ (i=0, ..., n−1) comprises a D-type flip-flop 51 having a reset function, and a switching circuit 52. The flip-flop 51 has an input terminal for inputting the test input signal which is fed via the test input terminal $20_i$, a reset terminal for inputting the control signal 28, and a clock terminal for inputting the clock signal CLK. The switching circuit 52 comprises an OR circuit 52a and an AND circuit 52b. The OR circuit 52a carries out an OR operation on the basis of the test input signal and the control signal 28 to transmit the operated result to the AND circuit 52b. The AND circuit 52b carries out an AND operation on the basis of the output of the flip-flop 51 and the output of the OR circuit 52a to transmit an output signal 55 serving as the operated result to the test signal generator 14.

Figure 18:
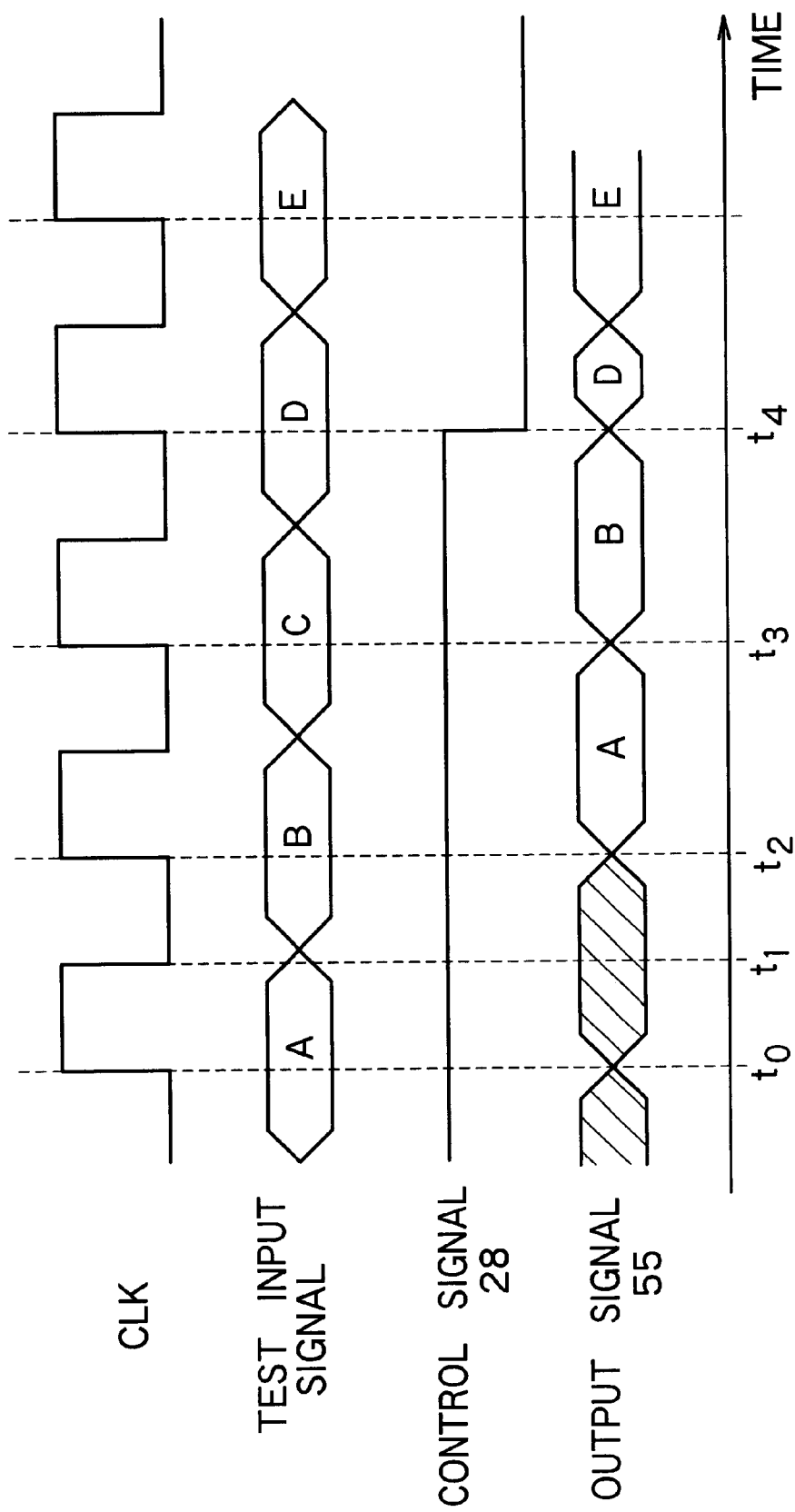
FIG. 18 is a timing chart for explaining the operation of the timing adjusting circuit shown in FIG. 17.

Referring to FIG. 18, the operation of the above described timing adjusting circuit $50_i$ (i=0, ..., n−1) will be described below. In the initial state, it is assumed that the node N1 and node N2 in the flip-flop 51 shown in FIG. 17 are in an "L" level.

If a clock signal CLK is inputted when the control signal 28 is in an "H" level state, when the clock signal CLK rises, data of the test input signal are latched, and data of the node N1 are transferred to the node N2. In addition, when the clock signal CLK rises, the data having been latched are transferred to the node N1, but data of the node N2 remain holding the last value. Therefore, data A of the test input signal latched at time to shown in FIG. 18 are transferred to the node N1 at time $t_1$, and transferred from the node N1 to the node N2 at time $t_2$. Therefore, the data A are outputted from the switching circuit 52 as the output signal 55 after time $t_2$. Furthermore, since data B are latched at time $t_2$, the data B are outputted as the output signal 55 at time $t_3$ after one clock from time $t_2$.

On the other hand, since the node N1 and node N2 of the flip-flop 51 are fixed to be in the "H" level when the control signal 28 is in the "L" level state, the operation synchronized with the clock signal CLK is not carried out, and the inputted test input signal is immediately outputted from the switching circuit 52. Therefore, since the control signal 28 is in the "L" level at time $t_4$ in FIG. 18, the inputted test input signal is outputted directly from the switching circuit 52.

The test signal generator 14 is designed to decode the test input signal (test command), which is fed from the timing adjusting circuits $50_0, \ldots, 50_{n-1}$, to generate a test signal 17a which serves to test the memory macro 5. Furthermore, the memory macro 5 having received the test signal 17a outputs a test data output 17b to the test output terminal group 21 via the test data output driver 18. Furthermore, the test signal generator 14 may output a test command as a test signal without decoding the test command.

As described above, in this preferred embodiment, in accordance with the control signal 28, the timing adjusting circuit $50_i$ (i=0, ..., n−1) is designed to either incorporate a test input signal, which is inputted via the test input terminal group 20, in synchronism with the clock signal CLK to transmit the test input signal to the test signal generator 14, or immediately incorporate the test input signal regardless of the clock signal CLK to transmit the test input signal to the test signal generator 14. Therefore, by causing the control signal to be in the "L" level, it is possible to change the timing in inputting the input signal to the memory macro 5 to test the memory macro 5, so that it is possible to test whether the memory macro 5 satisfies the specification concerning the lag and advance of the input signal.

In addition, by causing the control signal to be in the "H" level to incorporate the test input signal in synchronism with the clock signal CLK, it is possible to ignore the skew during the input to the test signal generator 14, so that it is possible to prevent the test circuit 10 from malfunctioning.

Furthermore, the memory macro 5 of the memory-embedded semiconductor integrated circuit device 1 in this preferred embodiment is suitably synchronous.

(Fifth Preferred Embodiment)

Figure 19:
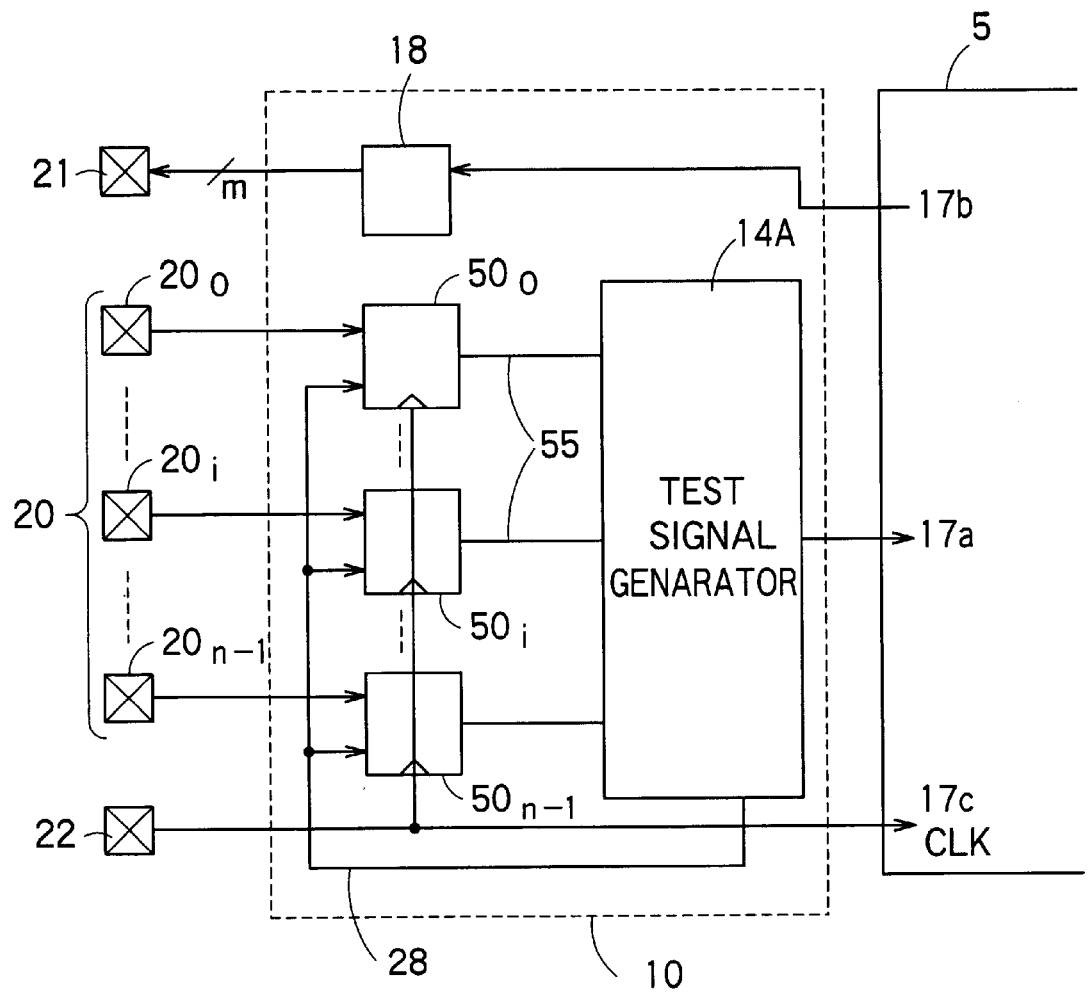
FIG. 19 is a block diagram showing the construction of the fifth preferred embodiment of the present invention.

The construction of the fifth preferred embodiment of a memory-embedded semiconductor integrated circuit device according to the present invention is shown in FIG. 19. In the memory-embedded semiconductor integrated circuit device in this preferred embodiment, the test signal generator 14 of the memory-embedded semiconductor integrated circuit device in the fourth preferred embodiment shown in FIG. 16 is replaced with a test signal generator 14A, and the control signal input terminal 27 thereof is eliminated. The test signal generator 14A is designed to generate a control signal 28 on the basis of a specific test command, which is fed via the test input terminal group 20 and the timing adjusting circuit $50_0, \ldots, 50_{n-1}$, and decode other test commands to generate a test signal to transmit the test signal to the memory macro 5.

The detailed construction of a portion generating the control signal 28 of the test signal generator 14A is shown in FIG. 20. This test signal generator 14A is provided with NAND gates 14a and 14b, and an R-S type flip-flop 14c. Furthermore, in order to simplify explanation, it is assumed in FIG. 20 that the number of the test input terminals $20_0, \ldots, 20_{n-1}$ is 3, so that the test command (output signal 55) fed from the timing adjusting circuits $50_0, \ldots, 50_{n-1}$ to the test signal generator 14A comprises 3-bit command input signals 55[0], 55[1] and 55[2].

The NAND gate 14a carries out a NAND operation on the basis of the inverted signals of the command input signals 55[0] and 55[1], and the command input signal 55[2] to transmit the operated result to a set terminal Sn of the R-S type flip-flop 14c. The NAND gate 14b carries out a NAND operation on the basis of the command input signals 55[0] and 55[1], and the inverted signal of the command input signal 55[2] to transmit the operated result to a reset terminal $R_n$ of the R-S type flip-flop 14c.

When the signal $S_n$ inputted to the set terminal of the R-S type flip-flop 14c is in the "L" level and when the signal $R_n$ inputted to the reset terminal thereof is in the "H" level, the R-S type flip-flop 14c operates so that the output signal Q, which will be the control signal 28, is in the "L" level. In addition, when the signal $S_n$ is in the "H" level and when the signal $R_n$ is in the "L" level, the R-S type flip-flop 14c operates so that the signal $Q_n$ is in the "H" level. Moreover, when both of the signals $S_n$ and $R_n$ are in the "H" level, the R-S type flip-flop 14c operates so that the signal $Q_n$ holds the last state. Furthermore, the input that both of the signals $S_n$ and $R_n$ are in the "L" level is inhibited.

The operation of the test signal generator 14A will be described below.

It is assumed that the initial state of the control signal 28 is the "L" level. At this time, if a test command for activating the control signal 28, i.e., a test command comprising a command input signal 55[0] of the "H" level, a signal 55[1] of the "H" level, and a signal 55[2] of the "L" level, is inputted to the test signal generator 14A, the output of the NAND gate 14*a* comes to have the "H" level, and the output of the NAND gate 14*b* comes to have the "L" level, so that the output of the R-S type flip-flop 14*c*, i.e., the control signal 28, comes to have the "H" level to be in an active state.

On the other hand, a test command for changing the state of the control signal 28 from the active state to an inactive state, i.e., a test command comprising a command input signal 55[0] of the "L" level, a signal 55[1] of the "L" level and a signal 55[2] of the "H" level, is inputted to the test signal generator 14A, the output of the NAND gate 14*a* comes to have the "L" level, and the output of the NAND gate 14*b* comes to have the "H" level, so that the control signal 28 outputted from the flip-flop 14*c* comes to have the "L" level to be in the inactive state.

By inputting a specific command as described above, the control signal 28 can be caused to be in the active or inactive state, so that the fifth preferred embodiment of a memory-embedded semiconductor integrated circuit device according to the present invention can be tested similar to that in the fourth preferred embodiment. Thus, the fifth preferred embodiment can have the same effects as those in the fourth preferred embodiment.

Furthermore, in this fifth preferred embodiment, it is possible to omit the control signal input terminal 27 in the fourth preferred embodiment.

Furthermore, the memory macro 5 of the memory-embedded semiconductor integrated circuit device 1 in this preferred embodiment is suitably synchronous.

(Sixth Preferred Embodiment)

Figure 21:
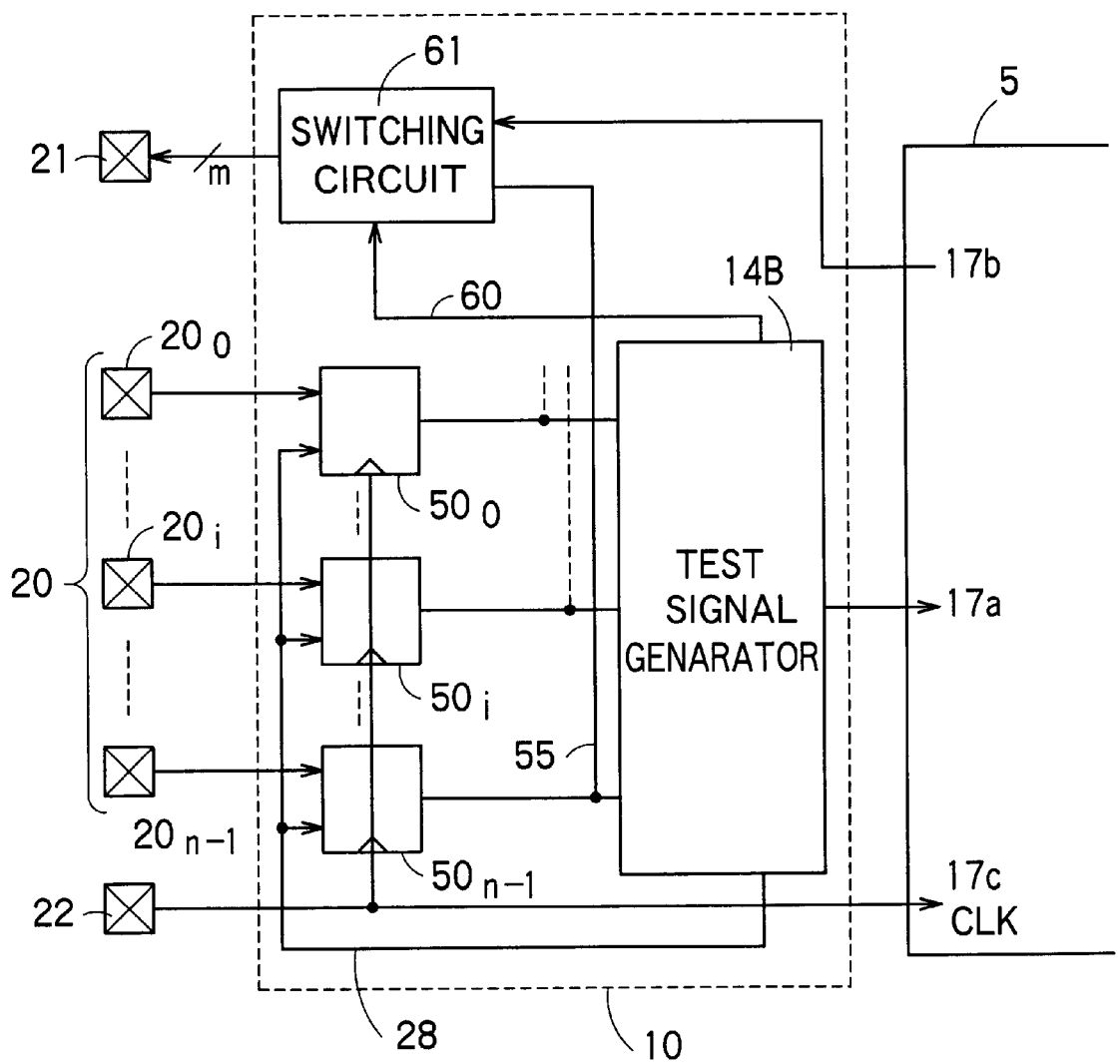
FIG. 21 is a block diagram showing the construction of the sixth preferred embodiment of the present invention.

The construction of the sixth preferred embodiment of a memory-embedded semiconductor integrated circuit device according to the present invention is shown in FIG. 21. In this sixth preferred embodiment, the memory-embedded semiconductor integrated circuit device is provided with a test signal generator 14B and a switching circuit 61 which are substituted for the test signal generator 14A and the test data output driver 18, respectively, in the memory-embedded semiconductor in the fifth preferred embodiment shown in FIG. 19.

The test signal generator 14B has the function of feeding an output switching signal 60 to the switching circuit 61 on the basis of a specific test command, in addition to the function of the test signal generator 14A in the fifth preferred embodiment. The switching circuit 61 is designed to selectively transmit a test data output, which is fed from the memory macro 5, or the output of the timing adjusting circuits $50_0, \ldots, 50_{n-1}$ to the test output terminal group 21 in accordance with the output switching signal 60.

The detailed construction of a portion for generating the control signal 28 of the test signal generator 14B, and a portion for generating the output switching signal 60 is shown in FIG. 22. The test signal generator 14B has a portion comprising NAND gates 14*a* and 124*b* and R-S type flip-flop 14*c* for generating the control signal 28, and a portion comprising NAND gates 14*b* and 14*d* and R-C type flip-flop 14*e* for generating the output switching signal 60. Since the portion for generating the control signal 28 is the same as that in the above described fifth preferred embodiment, the description thereof is omitted. Furthermore, in order to simplify explanation, it is assumed that the test command inputted to the test signal generator 14B comprises 3-bit command input signals 55[0], 55[1] and 55[2] similar to the fifth preferred embodiment.

The NAND gate 14*d* carries out a NAND operation on the basis of the inverted signal of the command input signal 55[0], and the command input signals 55[1] and 55[2] to transmit the operated result to the set terminal $S_n$ of the R-S type flip-flop 14*e*. In addition, the flip-flop 14*e* is designed to input the output of the NAND gate 14*b* to the reset terminal $R_n$ and to output the output switching signal 60 from the output terminal Q. Therefore, in this embodiment, only when the command input signal 55[0] has the "H" level and both of the signals 55[1] and 55[2] have the "L" level, the output switching signal 60 has the "H" level.

Figure 23:
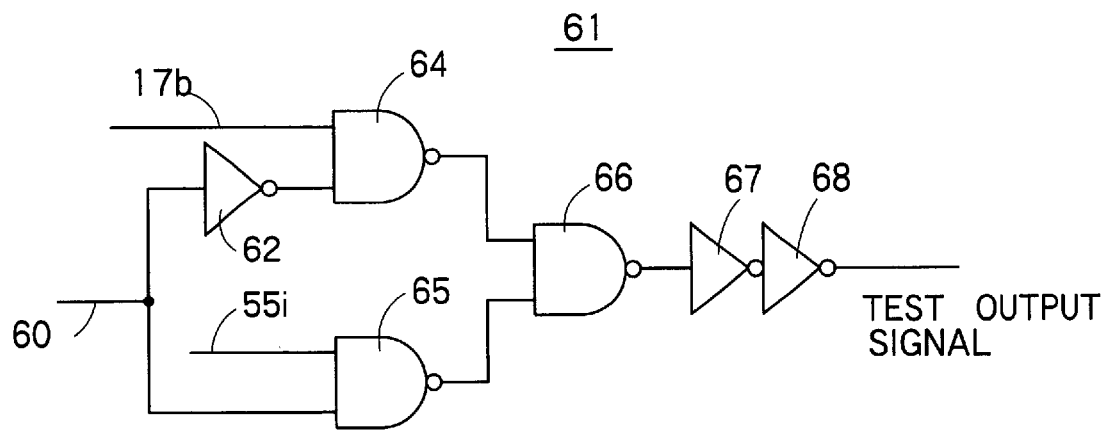
FIG. 23 is a circuit diagram showing the construction of a concrete example of a switching circuit for use in the sixth preferred embodiment.

The detailed construction of the switching circuit 61 is shown in FIG. 23. In the switching circuit 61 shown in FIG. 23, the number n of the test input terminals of the test input terminal group 20 is equal to the number m of the test output terminals of the test output terminal group 21, i.e., m=n. This switching circuit 61 comprises an inverter 62, NAND gates 64, 65, 66, and inverters 67, 68 for each of the timing adjusting circuits $50_i$ (i=0, ..., n−1).

The NAND gate 64 receives a signal, which is obtained by inverting the output switching signal 60 by means of the inverter 62, and an output (one output of m outputs) 17*b* of the memory macro 5 to carry out a NAND operation to transmit the operated result to the NAND gate 66. The NAND gate 65 receives an output 55*ii* of the timing adjusting circuit $50_i$ (i=0, ..., n−1), and the output switching signal 60 to carry out a NAND operation to transmit the operated result to the NAND gate 66. The NAND gate 66 carries out a NAND operation on the basis of the outputs of the NAND gates 64 and 65. The output of the NAND gate 66 passes through the inverters 67 and 68, which are connected in series, to be a test output signal which is transmitted to the corresponding output terminal.

In the switching circuit 61 shown in FIG. 23, when the output switching signal 60 has the "H" level, the output of the NAND gate always has the "H" level regardless of the output of the memory macro 5, so that the test output signal becomes the signal $55_i$ which is fed from the timing adjusting circuit $50_i$ (i=0, ..., n−1).

On the other hand, when the output switching signal 60 has the "L" level, the output of the NAND gate 65 always has the "H" level regardless of the value of the signal $55_i$, so that the test output signal becomes the output of the memory macro 5.

As described above, in the sixth preferred embodiment, when the output switching signal 60 has, e.g., the "H" level, the test input signal inputted via the test input terminal group 20 can be obtained via the test output terminal group 21, and when the output switching signal 60 has the "L" level, the test data output fed from the memory macro 5 can be obtained via the test output terminal group 21. Thus, it is possible to easily analyze whether defects exist in the test circuit 10 or the memory macro 5, so that it is possible to reduce the time required to carry out the test analysis. Furthermore, the sixth preferred embodiment can have the same effects as those of the fifth preferred embodiment.

Furthermore, in the above described preferred embodiment, the detailed construction of the switching circuit 61 has been described with respect to the case of m=n. In the case of m≠m, the switching circuit 16 in the first preferred embodiment shown in, e.g., FIG. 4 or 5, may be used. At this time, the input/output connecting signal 15 becomes the output switching signal 60.

Furthermore, the memory macro 5 of the memory-embedded semiconductor integrated circuit device 1 in the sixth preferred embodiment is suitably synchronous.

Figure 24:
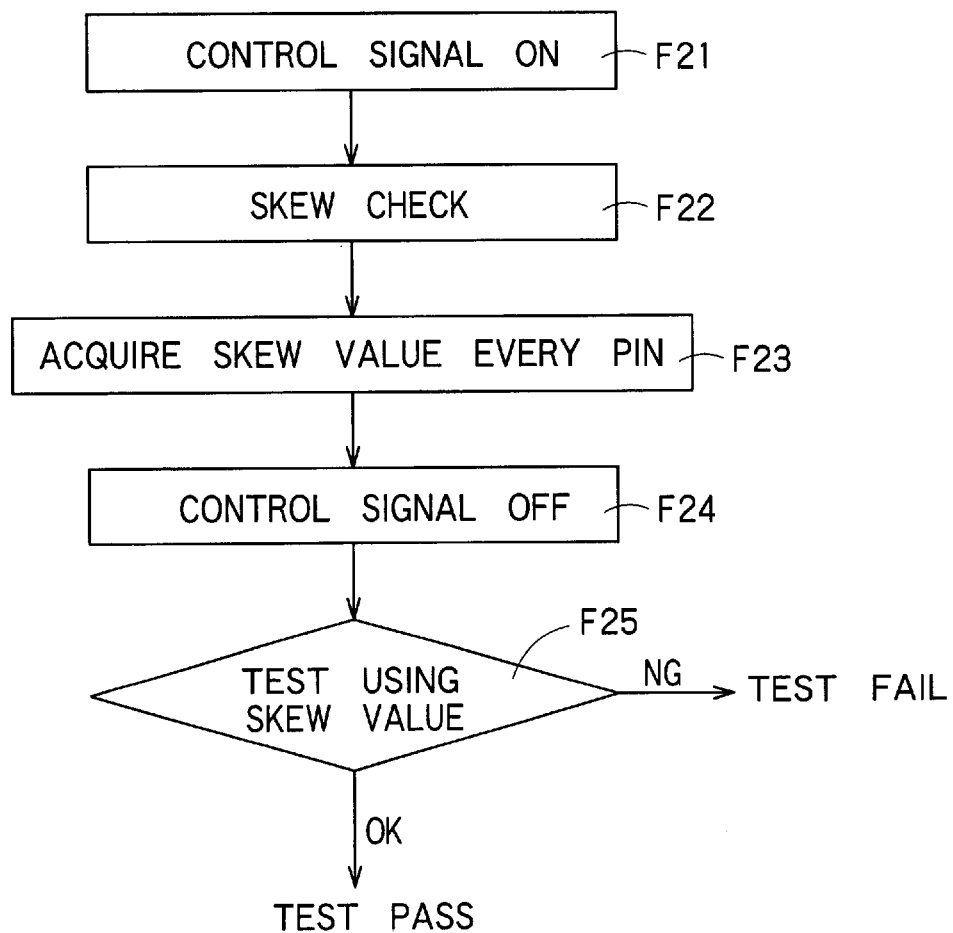
FIG. 24 is a flow chart for explaining a test method in the sixth preferred embodiment.
Figure 25:
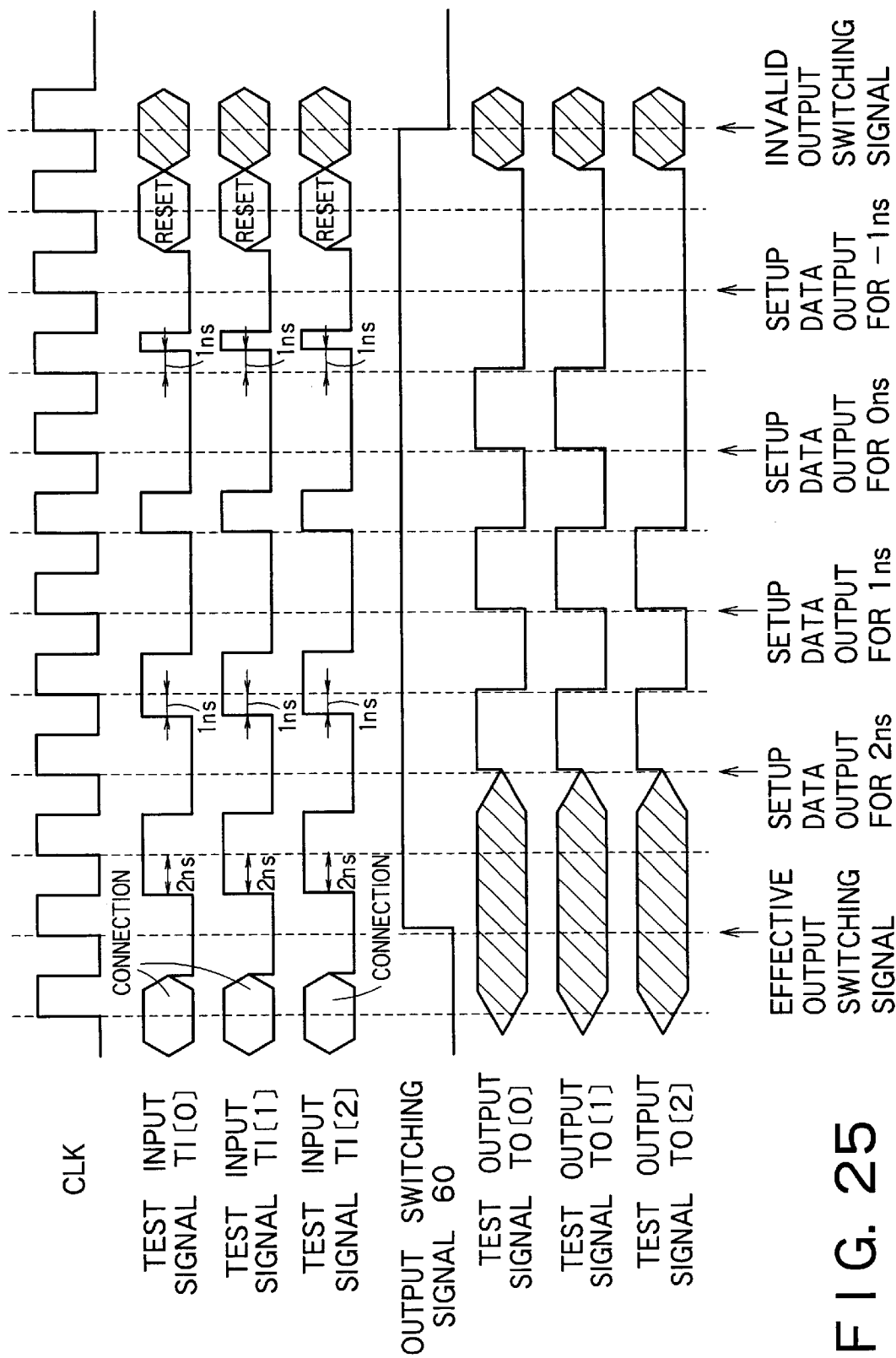
FIG. 25 is a timing chart for explaining a method for deriving a skew value in the sixth preferred embodiment.
Figure 26:
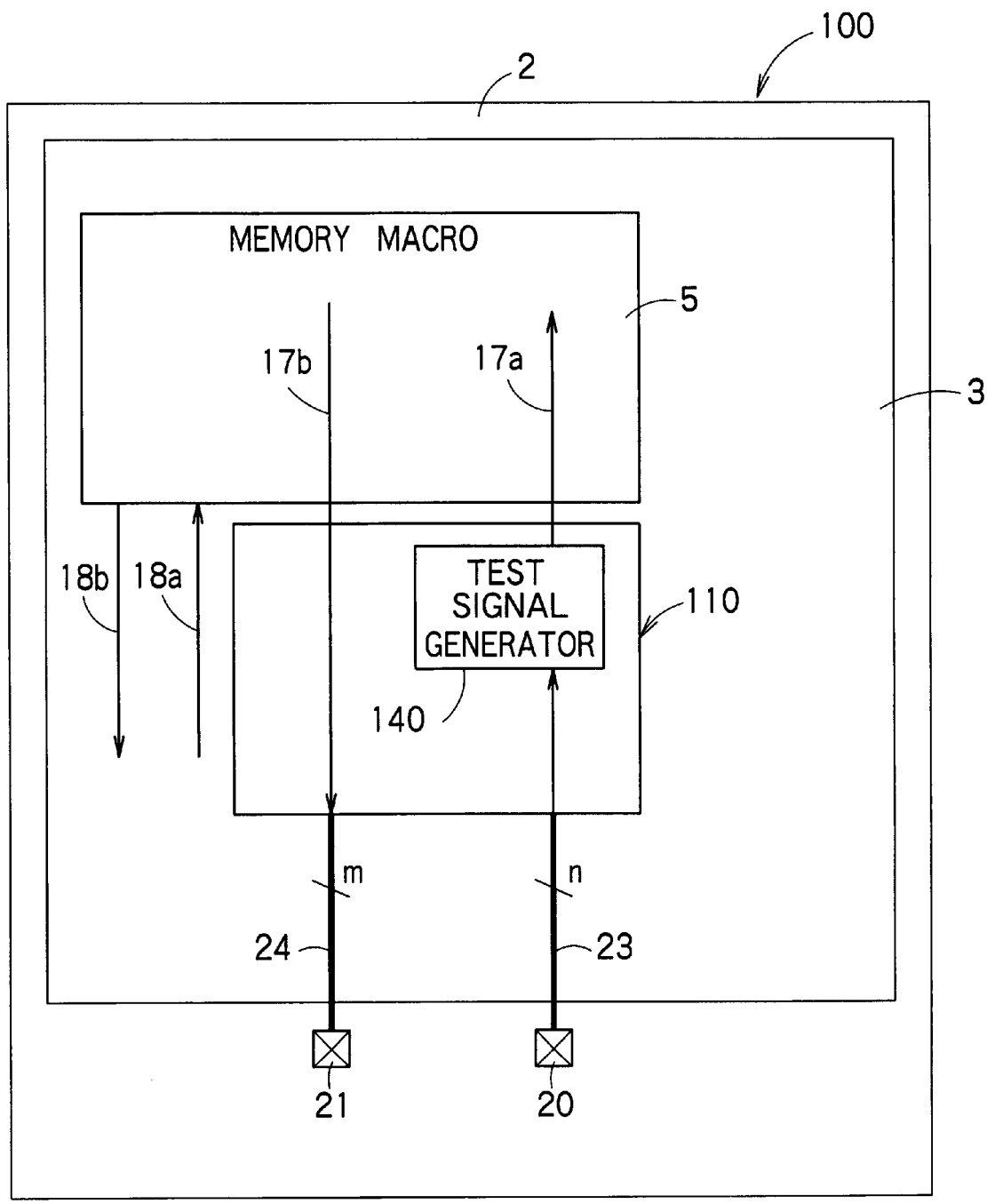
FIG. 26 is a block diagram showing a first example of a conventional memory-embedded semiconductor integrated circuit device.
Figure 27:
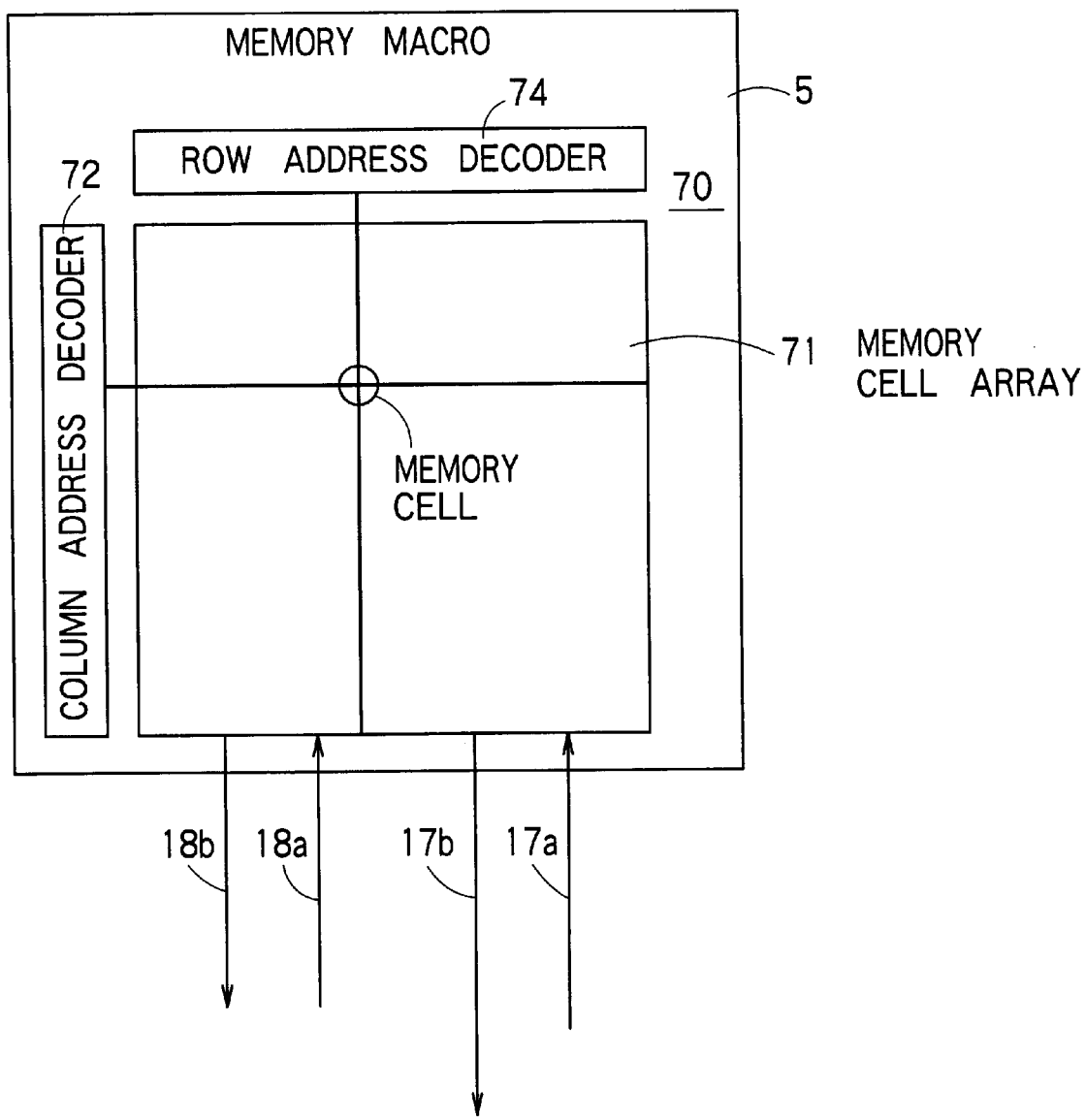
FIG. 27 is a schematic diagram for explaining the construction of a memory macro.
Figure 28:
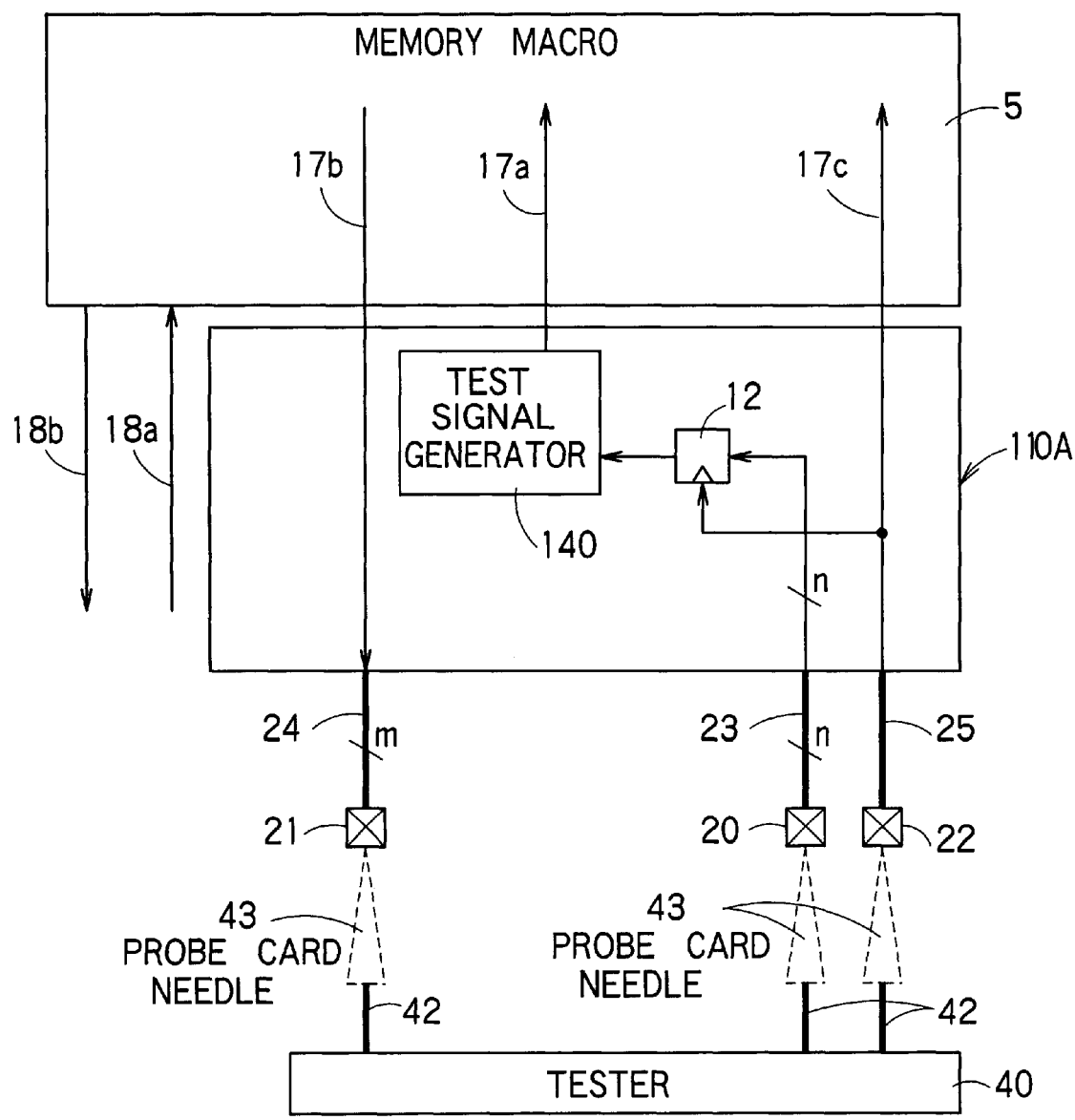
FIG. 28 is a block diagram showing a second example of a conventional memory-embedded semiconductor integrated circuit device.

In addition, in the above described sixth preferred embodiment, it is possible to measure the skew of the test input signal inputted to each of the test input terminals $20_i$ (i=0, ..., n−1), so that it is possible to carry out a calibration every one kind using the obtained skew. Referring to FIGS. 24 and 25, this will be described below.

First, as shown at step F21 in FIG. 24, the control signal 28 is turned ON, i.e., caused to have the "H" level. Then, the test input signal inputted from the test input terminal group 20 is incorporated into the timing adjusting circuits $50_0$, ..., $50_{n−1}$ in synchronism with the clock signal CLK to be transmitted to the test signal generator 14B. Therefore, similar to the description of the third preferred embodiment referring to FIGS. 10 through 13, the setup time and hold time of the test input signal inputted to each of the test input terminals $20_i$ (i=0, ..., n−1) are derived (see steps F22 and F23 in FIG. 24). For example, first, as shown in FIG. 25, the output switching signal 60 is caused to have the "H" level, and the test input signals TI[0], TI[1] and TI[2] are caused to be outputted from the test output terminal group 21 via the timing adjusting circuit $50_i$ and the switching circuit 51. Thereafter, the setup timing of each of the test input signals TI[0], TI[1] and TI[2] is changed to carry out the test to inspect the test output signals TO[0], TI[1] and TI[2], which are outputted from the test output terminal group 21, to acquire skew values, i.e., a setup time and a hold time, every pin (input terminal).

After each skew value is acquired, the control signal 28 is turned OFF (see step F24 in FIG. 24). Thereafter, it is possible to carry out a calibration using the skew values, so that it is possible to test whether the memory macro 5 satisfies the specification concerning the lag and advance of the input signal (see step F25 in FIG. 24).

Since the above described skew values exist between the test input terminal group 20 and the test circuit 10, it is required to add a signal delay time between the entrance of the test circuit 10 and the entrance of the memory macro 5, to the skew values to modify the skew values. Since the delay time between the entrance of the test circuit 10 and the entrance of the memory macro is not different every product, a value derived in design stage or a value measured in practice are used as the delay time. Thus, the skew values are modified, and a test input signal having the modified skew values is inputted to the test input terminal group 20 to test whether the memory macro 5 satisfies the specification.

Furthermore, while the test circuit has been separated from the memory macro in the first through sixth preferred embodiments, the test circuit may be provided in the memory macro.

As described above, according to the present invention, it is possible to shorten the test time.

In addition, according to the present invention, it is possible to prevent the test circuit from malfunctioning.

Moreover, according to the present invention, it is possible to test whether the memory macro satisfies the specification concerning the lag and advance of input.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A memory-embedded semiconductor integrated circuit device comprising:
  a logic part provided on a semiconductor substrate;
  a memory macro provided on said semiconductor substrate to be consolidated with said logic part;
  a test input terminal for inputting a test input signal;
  a test circuit including a test signal generator for generating an output switching signal and a test signal, which serves to carry out a test operation of said memory macro, on the basis of said test input signal, and a switching circuit for selectively outputting one of an output of said memory macro, which has been test-operated by said test signal, and said test input signal in accordance with said output switching signal; and
  a test output terminal for receiving an output of said switching circuit to output said output of said switching circuit to the outside.

2. A memory-embedded semiconductor integrated circuit device as set forth in claim 1, wherein said switching circuit selectively outputs one of said output of said memory macro, said test input signal, a first predetermined value and a second predetermined value in accordance with said output switching signal.

3. A memory-embedded semiconductor integrated circuit device as set forth in claim 1, wherein said test circuit has a synchronous incorporating circuit for incorporating said test input signal, which is fed via said test input terminal, in synchronism with a clock signal to output the incorporated signal in synchronism with said clock signal, and
  said test signal generator receives an output of said synchronous incorporating circuit and causes said switching circuit to selectively output one of said output of said memory macro and said output of said synchronous incorporating circuit in accordance with said output switching signal.

4. A memory-embedded semiconductor integrated circuit device as set forth in claim 3, wherein said synchronous incorporating circuit comprises a D-type flip-flop.

5. A memory-embedded semiconductor integrated circuit device as set forth in claim 1, which further comprises a test input wire provided between said test input terminal and said test circuit, and wherein said test input signal is fed from said test input wire directly to said switching circuit.

6. A memory-embedded semiconductor integrated circuit device as set forth in claim 1, which further comprises a test input wire provided between said test input terminal and said test circuit, and wherein said test input signal is fed from said test input wire to said switching circuit via a buffer.

7. A memory-embedded semiconductor integrated circuit device as set forth in claim 1, which further comprises a plurality of test input terminals, each of which comprises said test input terminal, and wherein said test output switching signal is generated when said test input signal inputted to each of said test input terminals has the same level to each other.

8. A memory-embedded semiconductor integrated circuit device comprising:
  a logic part provided on a semiconductor substrate;
  a memory macro provided on said semiconductor substrate to be consolidated with said logic part;
  an input terminal for inputting an input signal;
  a timing adjusting circuit for incorporating and outputting said input signal, which is inputted via said input terminal, in synchronism with a clock signal, or for immediately incorporating and outputting said input signal, in accordance with a control signal;
  a generator for generating a signal, which serves to operate said memory macro, on the basis of said input signal which is fed via said timing adjusting circuit; and an output terminal for receiving an output of said memory macro, which has been operated by said signal, to output said output of said memory macro to the outside.

9. A memory-embedded semiconductor integrated circuit device as set forth in claim 8, wherein said input terminal is a test input terminal for inputting a test input signal, said generator is a test signal generator for generating a test signal, which serves to operate said memory macro, on the basis of said test input signal which is fed via said timing adjusting circuit, said test signal generator being associated with said timing adjusting circuit to serve as a test circuit for said memory macro, and said output terminal is a test output terminal for receiving said output of said memory macro, which has been operated by said test signal, to output said output of said memory macro to the outside.

10. A memory-embedded semiconductor integrated circuit device as set forth in claim 9, wherein said test signal generator generates an output switching signal on the basis of a specific test input signal, and said test circuit further comprises a switching circuit for selecting one of said output of said memory macro and an output of said timing adjusting circuit in accordance with said output switching signal to output the selected one to said test output terminal.

11. A memory-embedded semiconductor integrated circuit device as set forth in claim 9, wherein said timing adjusting circuit comprises:

a synchronous incorporating circuit for incorporating a test input signal, which is fed via said test input terminal, in synchronism with said clock signal to output the incorporated signal in synchronism with said clock signal; and a switching circuit for selectively outputting one of said test input signal, which is fed via said test input terminal, and an output of said synchronous incorporating circuit on the basis of said control signal.

12. A memory-embedded semiconductor integrated circuit device as set forth in claim 11, wherein said synchronous incorporating circuit comprises a D-type flip-flop with a reset function, and said switching circuit comprises an OR gate for receiving a signal, which is fed via said test input terminal, and said control signal, and an AND gate for receiving an output of said OR gate and an output of said D-type flip-flop.

13. A memory-embedded semiconductor integrated circuit device as set forth in claim 12, wherein said D-type flip-flop has an input terminal for inputting said test input signal, a clock terminal for inputting said clock signal, and a reset terminal for inputting said control signal.

14. A memory-embedded semiconductor integrated circuit device as set forth in claim 8, which further comprises a control input terminal for inputting said control signal.

15. A memory-embedded semiconductor integrated circuit device as set forth in claim 9, wherein said test signal generator generates said control signal on the basis of a specific test input signal.

16. A method for testing a memory-embedded semiconductor integrated circuit device comprising: a logic part provided on a semiconductor substrate; a memory macro provided on said semiconductor substrate to be consolidated with said logic part; a test input terminal for inputting a test input signal comprising a test command or test data; a test circuit including a test signal generator for generating an output switching signal and a test signal, which serves to carry out a test operation of said memory macro, on the basis of said test input signal, and a switching circuit for selectively outputting one of an output of said memory macro, which has been test-operated by said test signal, and said test input signal in accordance with said output switching signal; and a test output terminal for receiving an output of said switching circuit to output said output of said switching circuit to the outside, said method comprising the steps of:

inputting said test command to said test input terminal, and activating said output switching signal;

inputting said test data to said test input terminal; and receiving data, which are outputted from said switching circuit, via said test output terminal to compare the received data with said test data.

17. A method for testing a memory-embedded semiconductor integrated circuit device as set forth in claim 16, wherein said test circuit has a synchronous incorporating circuit for incorporating said test input signal, which is fed via said test input terminal, in synchronism with a clock signal to output the incorporated signal in synchronism with said clock signal, and said test signal generator receives an output of said synchronous incorporating circuit and causes said switching circuit to selectively output one of said output of said memory macro and said output of said synchronous incorporating circuit in accordance with said output switching signal, said test method further comprising a step of carrying out a calibration, which comprises the steps of:

inputting said test command to said test input terminal, and activating said output switching signal;

inputting said test data to said test input terminal at a timing in allowing to surely input said test data;

changing a timing in inputting said test data to said test input terminal, to repeat the input of said test data to said test input terminal; and receiving data, which are outputted from said switching circuit, via said test output terminal to determine a setup time or a hold time for a signal, which is inputted to said test input terminal, on the basis of the received data.

18. A method for testing a memory-embedded semiconductor integrated circuit device as set forth in claim 17, which further comprises a step of inputting a test signal having the determined setup time or hold time, to test said memory macro.

19. A method for testing a memory-embedded semiconductor integrated circuit device comprising: a logic part provided on a semiconductor substrate; a memory macro provided on said semiconductor substrate to be consolidated with said logic part; a test input terminal for inputting a test input signal comprising a test command or test data; a test circuit including a timing adjusting circuit for incorporating and outputting said test input signal, which is inputted via said test input terminal, in synchronism with a clock signal, or for immediately incorporating and outputting said test input signal, in accordance with a control signal, and a test signal generator for generating a test signal, which serves to operate said memory macro, on the basis of said test input signal which is fed via said timing adjusting circuit; and a test output terminal for receiving an output of said memory macro, which has been operated by said test signal, to output said output of said memory macro to the outside, said method comprising the step of:

changing a timing in inputting said test data to said test input terminal, to repeat the input of said test data to said test input terminal while said control signal is in an inactive state.

20. A method for testing a memory-embedded semiconductor integrated circuit device as set forth in claim 19, wherein said test signal generator generates an output switching signal on the basis of a specific test input signal, and said test circuit further comprises a switching circuit for selecting one of said output of said memory macro and an output of said timing adjusting circuit in accordance with said output switching signal to output the selected one to said test output terminal, said test method further comprising a step of carrying out a calibration while said control signal is in an active state, said step of carrying out the calibration comprising the steps of:

inputting said test command to said test input terminal, and activating said output switching signal;

inputting said test data to said test input terminal at a timing in allowing to surely input said test data;

changing a timing in inputting said test data to said test input terminal, to repeat the input of said test data to said test input terminal; and receiving data, which are outputted from said switching circuit, via said test output terminal to determine a setup time or a hold time for a signal, which is inputted to said test input terminal, on the basis of the received data.

* * * * *